(12) United States Patent
Sawada et al.

(10) Patent No.: US 9,018,985 B2
(45) Date of Patent: Apr. 28, 2015

(54) POWER MODULE AND OUTPUT CIRCUIT

(75) Inventors: Takashi Sawada, Kyoto (JP); Masao Saito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/814,132

(22) PCT Filed: Aug. 4, 2011

(86) PCT No.: PCT/JP2011/067846
§ 371 (c)(1),
(2), (4) Date: Apr. 10, 2013

(87) PCT Pub. No.: WO2012/018073
PCT Pub. Date: Feb. 9, 2012

(65) Prior Publication Data
US 2013/0200929 A1    Aug. 8, 2013

(30) Foreign Application Priority Data

Aug. 4, 2010  (JP) ................. 2010-175403

(51) Int. Cl.
*H03K 3/00*       (2006.01)
*H03K 17/16*      (2006.01)
(Continued)

(52) U.S. Cl.
CPC .............. *H03K 17/56* (2013.01); *H01L 27/088* (2013.01); *H01L 2924/1203* (2013.01); *H01L 2924/13055* (2013.01); *H01L 2924/13091* (2013.01); *H02M 1/08* (2013.01); *H02M 1/38* (2013.01); *H02M 7/538* (2013.01); *H03K 17/063* (2013.01); *H03K 2017/066* (2013.01); *H01L 24/32* (2013.01); *H01L 24/45* (2013.01); *H01L 24/48* (2013.01); *H01L 24/49* (2013.01); *H01L 24/73* (2013.01); *H01L 24/85* (2013.01); *H01L 25/072* (2013.01); *H01L 2224/32225* (2013.01); *H01L 2224/45124* (2013.01); *H01L 2224/45144* (2013.01); *H01L 2224/45147* (2013.01); *H01L 2224/48137* (2013.01); *H01L 2224/48227* (2013.01); *H01L 2224/4903* (2013.01);
(Continued)

(58) Field of Classification Search
None
See application file for complete search history.

(56) References Cited

U.S. PATENT DOCUMENTS 6,208,185 B1 *   3/2001   John et al. ............. 327/170
6,331,794 B1 *  12/2001   Blanchard ............. 327/112
(Continued)

FOREIGN PATENT DOCUMENTS

JP   2002-368121 A   12/2002
JP   2003-174766 A    6/2003
(Continued)

OTHER PUBLICATIONS

Machine translation of previously filed JP 2005-304218A.
(Continued)

*Primary Examiner* — Lincoln Donovan
*Assistant Examiner* — Khareem E Almo
(74) *Attorney, Agent, or Firm* — Rabin & Berdo, P.C.

(57) ABSTRACT

A power module (2) includes a first high-side main-circuit MOSFET (21) and a second low-side main-circuit MOSFET (22) connected in series thereto. The series circuit of the MOSFETs (21, 22) is connected in parallel to a power source (4). A first short-circuit MOSFET (25) is connected between the gate and the source of the first main-circuit MOSFET (21). A second short-circuit MOSFET (26) is connected between the gate and the source of the second main-circuit MOSFET (22).

18 Claims, 9 Drawing Sheets

(51) Int. Cl.
*H03K 17/56* (2006.01)
*H02M 1/08* (2006.01)
*H02M 1/38* (2007.01)
*H02M 7/538* (2007.01)
*H03K 17/06* (2006.01)
*H01L 25/07* (2006.01)
*H01L 27/088* (2006.01)
*H01L 23/00* (2006.01)
*H02M 7/00* (2006.01)

(52) U.S. Cl.
CPC ............... *H01L 2224/49175* (2013.01); *H01L 2224/49431* (2013.01); *H01L 2224/73265* (2013.01); *H01L 2224/85424* (2013.01); *H01L 2224/85447* (2013.01); *H01L 2924/10253* (2013.01); *H01L 2924/10272* (2013.01); *H01L 2924/19107* (2013.01); *H01L 2924/01013* (2013.01); *H01L 2924/01014* (2013.01); *H01L 2924/01028* (2013.01); *H01L 2924/01029* (2013.01); *H01L 2224/49111* (2013.01); H03K 17/06 (2013.01); *H01L 2224/48472* (2013.01); *H01L 2224/45014* (2013.01); H02M 7/003 (2013.01); *H01L 2924/3011* (2013.01)

(56) References Cited

U.S. PATENT DOCUMENTS

| | | | |
|---|---|---|---|
| 6,876,245 B2 * | 4/2005 | de Buda | 327/427 |
| 7,602,228 B2 * | 10/2009 | Mazzola et al. | 327/423 |
| 7,907,001 B2 * | 3/2011 | Mazzola et al. | 327/423 |
| 8,526,207 B2 * | 9/2013 | Yamagiwa et al. | 363/125 |
| 2002/0179945 A1 | 12/2002 | Sakamoto et al. | |
| 2002/0190285 A1 | 12/2002 | Sakamoto et al. | |
| 2004/0189353 A1 * | 9/2004 | Hatade et al. | 327/112 |
| 2004/0227560 A1 * | 11/2004 | de Buda | 327/427 |
| 2005/0218489 A1 | 10/2005 | Satou et al. | |
| 2006/0186933 A1 | 8/2006 | Kimura et al. | |
| 2007/0145580 A1 | 6/2007 | Satou et al. | |
| 2009/0079491 A1 | 3/2009 | Kawamura | |
| 2009/0218683 A1 | 9/2009 | Satou et al. | |
| 2010/0026370 A1 * | 2/2010 | Mazzola et al. | 327/423 |
| 2010/0141229 A1 | 6/2010 | Satou et al. | |
| 2010/0237911 A1 * | 9/2010 | Svensson | 327/109 |
| 2011/0062491 A1 | 3/2011 | Nakata | |
| 2011/0121884 A1 * | 5/2011 | Mazzola et al. | 327/430 |
| 2011/0304389 A1 * | 12/2011 | Vogler et al. | 327/581 |
| 2012/0086499 A1 * | 4/2012 | Husain et al. | 327/434 |
| 2012/0206171 A1 * | 8/2012 | Kimura | 327/109 |
| 2013/0049843 A1 * | 2/2013 | Jorge et al. | 327/438 |
| 2013/0063200 A1 * | 3/2013 | Itoh et al. | 327/434 |
| 2013/0154391 A1 * | 6/2013 | Urciuoli | 307/112 |
| 2013/0181748 A1 * | 7/2013 | Zajc | 327/109 |
| 2013/0200929 A1 * | 8/2013 | Sawada et al. | 327/109 |
| 2013/0265095 A1 * | 10/2013 | Mazzola et al. | 327/379 |

FOREIGN PATENT DOCUMENTS

| | | |
|---|---|---|
| JP | 2005-294464 A | 10/2005 |
| JP | 2005-304218 A | 10/2005 |
| JP | 2006-230166 A | 8/2006 |
| JP | 2009-081962 A | 4/2009 |
| WO | 2010/004802 A1 | 1/2010 |

OTHER PUBLICATIONS

Machine translation of previously filed JP 2003-174766A.
International preliminary report on patentability (Chapter I) with a Notification from the International Bureau (Form PCT/IB/326) and English translation thereof.

* cited by examiner

FIG. 3

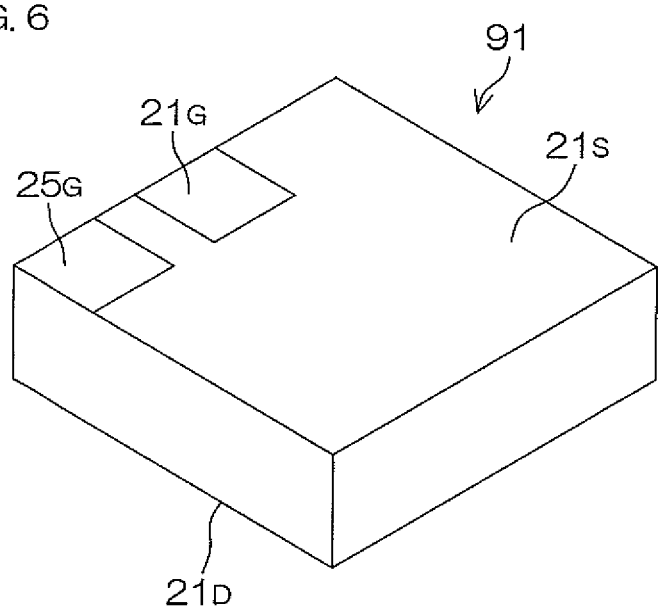

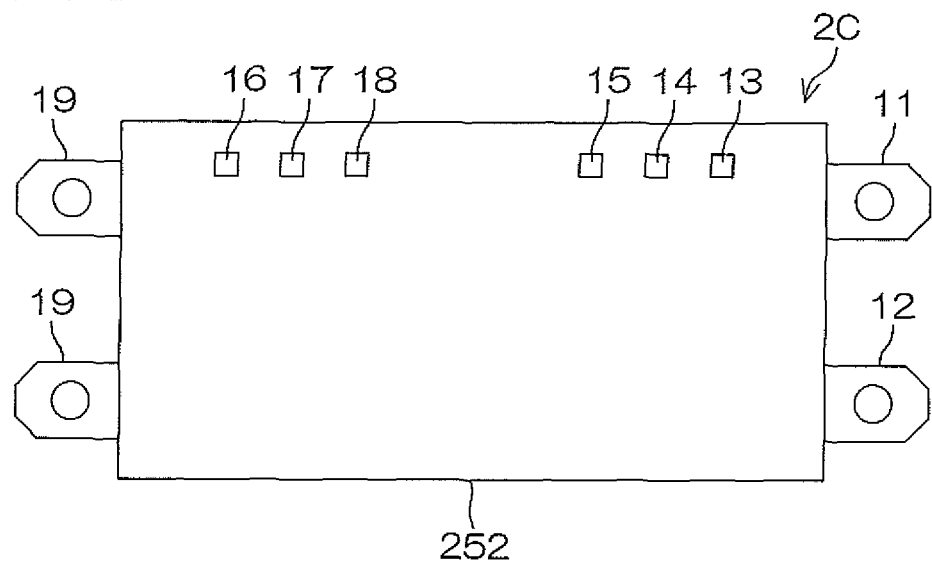

POWER MODULE AND OUTPUT CIRCUIT

TECHNICAL FIELD

The present invention relates to a power module for use in, for example, a half-bridge output circuit, and relates to an output circuit including the power module.

BACKGROUND ART

FIG. 8 is an electric circuit diagram showing a structure of a conventional half-bridge output circuit.

The half-bridge output circuit 101 includes a first high-side MOSFET (Metal Oxide Semiconductor Field Effect Transistor) 102, a second low-side MOSFET 103 connected in series to the first MOSFET 102, a gate drive circuit 104 for driving the MOSFETs 102 and 103, and a control unit 105 that controls the gate drive circuit 104. The first MOSFET 102 and the second MOSFET 103 are connected in series to a power source 106.

A first diode 107 and a second diode 108 are connected in parallel to the first MOSFET 102 and the second MOSFET 103, respectively. An anode of the first diode 107 is connected to a source of the first MOSFET 102, whereas a cathode of the first diode 107 is connected to a drain of the first MOSFET 102. An anode of the second diode 108 is connected to a source of the second MOSFET 103, whereas a cathode of the second diode 108 is connected to a drain of the second MOSFET 103.

A load 109 is connected between a connection point at which the first MOSFET 102 and the second MOSFET 103 are connected together and a source terminal of the second MOSFET 103. Based on a gate control signal emitted from the control unit 105, the gate drive circuit 104 supplies a gate drive signal to a gate terminal of the first MOSFET 102 through a first gate resistance 111, and supplies a gate drive signal to a gate terminal of the second MOSFET 103 through a second gate resistance 112.

CITATION LIST

Patent Literature

PTL 1: Japanese Unexamined Patent Publication No. 2009-81962

SUMMARY OF INVENTION

Technical Problem

In the aforementioned half-bridge output circuit 101, a power source voltage is applied to the second low-side MOSFET 103 when the first high-side MOSFET 102 is turned on in a state in which both MOSFETs 102 and 103 are off, and therefore a drain-to-source voltage $V_{DS}$ of the second MOSFET 103 rises rapidly. At this time, a displacement current $I_{DG}=C_{DG}\cdot dV_{DG}/dt$ flows from the drain of the second MOSFET 103 toward the gate wherein $V_{DG}$ designates a drain-to-gate voltage, and $C_{DG}$ designates the drain-to-gate parasitic capacitance of the second MOSFET 103. The value $dV_{DG}/dt$ is determined by rise time (tr) when the first MOSFET 102 is turned on.

This displacement current $I_{DG}$ flows to the second gate resistance 112 in the gate drive circuit 104, and therefore a gate potential rises because of a voltage drop caused by the second gate resistance 112, and the gate-to-source voltage $V_{GS}$ of the second MOSFET 103 rises. A peak value of the gate-to-source voltage $V_{GS}$ of the second MOSFET 103 is substantially proportional to $C_{DG}\cdot R_G\cdot dV_{DG}/dt$ wherein $R_G$ designates a resistance value of the second gate resistance 112. If the peak value of the gate-to-source voltage $V_{GS}$ of the second MOSFET 103 exceeds a threshold voltage, the second MOSFET 103 will be turned on, and a penetration current will flow.

Likewise, a power source voltage is applied to the first high-side MOSFET 102 when the second low-side MOSFET 103 is turned on in a state in which both MOSFETs 102 and 103 are off. Therefore, there is a fear that the drain-to-source voltage $V_{GS}$ of the first MOSFET 102 will rise by means of the same operation as above, and a penetration current will flow.

It is an object of the present invention to provide a power module and an output circuit that are capable of restraining or preventing a rise in the gate-to-source voltage of one of two switching devices connected in series when the other switching device is turned on.

It is another object of the present invention to provide a power module that is capable of restraining or preventing a rise in the gate-to-source voltage of one of two switching devices connected in series when the other switching device is turned on and that is capable of being reduced in size.

Solution to Problem

A power module of the present invention includes a first power switching device, a second power switching device connected in series to the first power switching device, a first gate short-circuit switching device connected between a gate and a source of the first power switching device, and a second gate short-circuit switching device connected between a gate and a source of the second power switching device.

When the first power switching device is turned on, a power source voltage is applied to the second power switching device, and therefore the drain-to-source voltage of the second power switching device rises rapidly. Therefore, a displacement current flows from the drain of the second power switching device to the gate. At this time, if the gate-to-source portion of the second power switching device is short-circuited by the second gate short-circuit switching device, an increase in the gate-to-source voltage of the second power switching device can be restrained or prevented.

When the second power switching device is turned on, a power source voltage is applied to the first power switching device, and therefore the drain-to-source voltage of the first power switching device rises rapidly. At this time, if the gate-to-source portion of the first power switching device is short-circuited by the first gate short-circuit switching device, an increase in the gate-to-source voltage of the first power switching device can be restrained or prevented.

In one embodiment of the present invention, the first power switching device and the second power switching device are switching devices each of which is composed mainly of silicon carbide (SiC).

In one embodiment of the present invention, each of the first power switching device and the second power switching device comprises an IGBT (Insulated Gate Bipolar Transistor).

In one embodiment of the present invention, the first power switching device and the first gate short-circuit switching device are mounted on a same mounting substrate, whereas the second power switching device and the second gate short-circuit switching device are mounted on a same mounting substrate. According to this arrangement, it becomes possible to reduce the power module in size. Additionally, it is possible to shorten a wire that is used to connect each power switching device and the corresponding gate short-circuit switching device together. Therefore, it is possible to reduce impedance between each power switching device and the corresponding gate short-circuit switching device. As a result, it is possible to improve the rise-restraining effect of the gate-to-source voltage of each power switching device.

In one embodiment of the present invention, the mounting substrate on which the first power switching device and the first gate short-circuit switching device are mounted and the mounting substrate on which the second power switching device and the second gate short-circuit switching device are mounted are same. According to this arrangement, it becomes possible to reduce the power module in size.

In one embodiment of the present invention, the power module further includes an electrically-conductive common land that is formed on the mounting substrate and to which a source of either one of the first power switching device and the second power switching device is electrically connected and to which a drain of a remaining power switching device thereof is electrically connected. The common land may be a plate-like element shaped substantially like the letter U when viewed planarly. The common land may be a plate-like element made of copper or aluminum. In this arrangement, the source of the power switching device that is the either one and the drain of the remaining power switching device are connected together through the common land formed on the mounting substrate.

In one embodiment of the present invention, the power module further includes a first gate-land that is formed on the mounting substrate and to which the gate of the first power switching device is electrically connected and to which the first gate short-circuit switching device is joined, a first short-circuit gate-land that is formed on the mounting substrate and to which a gate of the first gate short-circuit switching device is electrically connected, a second gate-land that is formed on the mounting substrate and to which the gate of the second power switching device is electrically connected and to which the second gate short-circuit switching device is joined, and a second short-circuit gate-land that is formed on the mounting substrate and to which a gate of the second gate short-circuit switching device is electrically connected. The common land includes a pair of arm portions and a connection portion by which the pair of arm portions are connected together, and either one of a group of the first gate-land and the first short-circuit gate-land and a group of the second gate-land and the second short-circuit gate-land is disposed between the pair of arm portions of the common land whereas a remaining group is disposed on a side opposite to the either one with respect to one of the pair of arm portions of the common land.

In one embodiment of the present invention, the first gate-land and the first short-circuit gate-land are disposed adjacently in a direction in which the connection portion of the common land extends, and the second gate-land and the second short-circuit gate-land are disposed adjacently in a direction in which the connection portion of the common land extends. According to this arrangement, it becomes possible to dispose each power switching device and the gate short-circuit switching device corresponding thereto close to each other. Therefore, it is possible to shorten a wire that is used to connect each power switching device and the corresponding gate short-circuit switching device together. Therefore, it is possible to reduce impedance between each power switching device and the corresponding gate short-circuit switching device. As a result, it is possible to improve the rise-restraining effect of the gate-to-source voltage of each power switching device.

In one embodiment of the present invention, the mounting substrate is a DBC substrate in which a copper foil is bonded directly to ceramics, and the common land, the first gate-land, the first short-circuit gate-land, the second gate-land, and the second short-circuit gate-land are made of the copper foil.

In one embodiment of the present invention, the first power switching device and the first gate short-circuit switching device are disposed in a same chip, and the second power switching device and the second gate short-circuit switching device are disposed in a same chip. According to this arrangement, it becomes possible to make the power module even smaller in size. Additionally, it is possible to make impedance between each power switching device and the corresponding gate short-circuit switching device even smaller. As a result, it is possible to make the rise-restraining effect of the gate-to-source voltage of each power switching device even greater.

In one embodiment of the present invention, the first power switching device and the second power switching device are alternately turned on with a dead time between their respective ON states. Additionally, the first gate short-circuit switching device is turned on before the second power switching device is turned on, and the first gate short-circuit switching device is turned off before the first power switching device is turned on after a first predetermined period of time elapses after the second power switching device is turned on. Additionally, the second gate short-circuit switching device is turned on before the first power switching device is turned on, and the second gate short-circuit switching device is turned off before the second power switching device is turned on after a second predetermined period of time elapses after the first power switching device is turned on.

In one embodiment of the present invention, the first predetermined period of time is set to be more than time during which a drain-to-source voltage of the first power switching device rises after the second power switching device is turned on. Additionally, the second predetermined period of time is set to be more than time during which a drain-to-source voltage of the second power switching device rises after the first power switching device is turned on.

According to this arrangement, the gate-to-source portion of the second power switching device is short-circuited by the second gate short-circuit switching device when the first power switching device is turned on, and therefore an increase in the gate-to-source voltage of the second power switching device can be restrained or prevented. Additionally, the gate-to-source portion of the first power switching device is short-circuited by the first gate short-circuit switching device when the second power switching device is turned on, and therefore an increase in the gate-to-source voltage of the first power switching device can be restrained or prevented.

In one embodiment of the present invention, the first predetermined period of time is set to be 200 nsec or more, and the second predetermined period of time is set to be 200 nsec or more.

In one embodiment of the present invention, the power module further includes a first connection metal member for connecting the first power switching device and the first gate short-circuit switching device together and a second connection metal member for connecting the second power switching device and the second gate short-circuit switching device together. The first connection metal member and the second connection metal member may be wire-like or frame-like or ribbon-like connection metal members each of which is made of Au or Cu or Al.

In one embodiment of the present invention, the power module further includes a first source sense terminal to which a first current detecting element included in the first power switching device is connected and a second source sense terminal to which a second current detecting element included in the second power switching device is connected. According to this arrangement, it becomes possible to connect the first source sense terminal and the second source sense terminal to an overcurrent protection circuit. As a result, it becomes possible to quickly cut off an overcurrent resulting from, for example, the short circuit of a load.

An output circuit of the present invention includes the power module according to any one of claim 1 to claim 16, a gate drive circuit that drives the first power switching device, the second power switching device, the first gate short-circuit switching device, and the second gate short-circuit switching device, and a control unit that controls the gate drive circuit, and the control unit comprises a microcomputer. According to the present invention, it is possible to restrain or prevent a rise in the gate-to-source voltage of one of the first and second switching devices when the other switching device is turned on.

In one embodiment of the present invention, the control unit includes a unit for generating a gate control signal with respect to the first power switching device, the second power switching device, the first gate short-circuit switching device, and the second gate short-circuit switching device. The gate drive circuit generates respective gate drive signals corresponding to the gate control signals generated by the control unit, and supplies the gate drive signal to a gate of a corresponding one of the switching devices.

The aforementioned or other objects, features, and effects of the present invention will be clarified by the following description of embodiments with reference to the accompanying drawings.

BRIEF DESCRIPTION OF DRAWINGS

FIG. 3 is a time chart showing one example of gate control signals generated by a control unit.

FIG. 6 is a perspective view showing an exterior of a chip in which a first main-circuit MOSFET and a first short-circuit MOSFET are formed on the same semiconductor substrate.

FIG. 7B is a pictorial plan view showing an exterior of the power module of FIG. 7A.

DESCRIPTION OF EMBODIMENTS

Embodiments of the present invention will be hereinafter described in detail with reference to the accompanying drawings.

Figure 1:
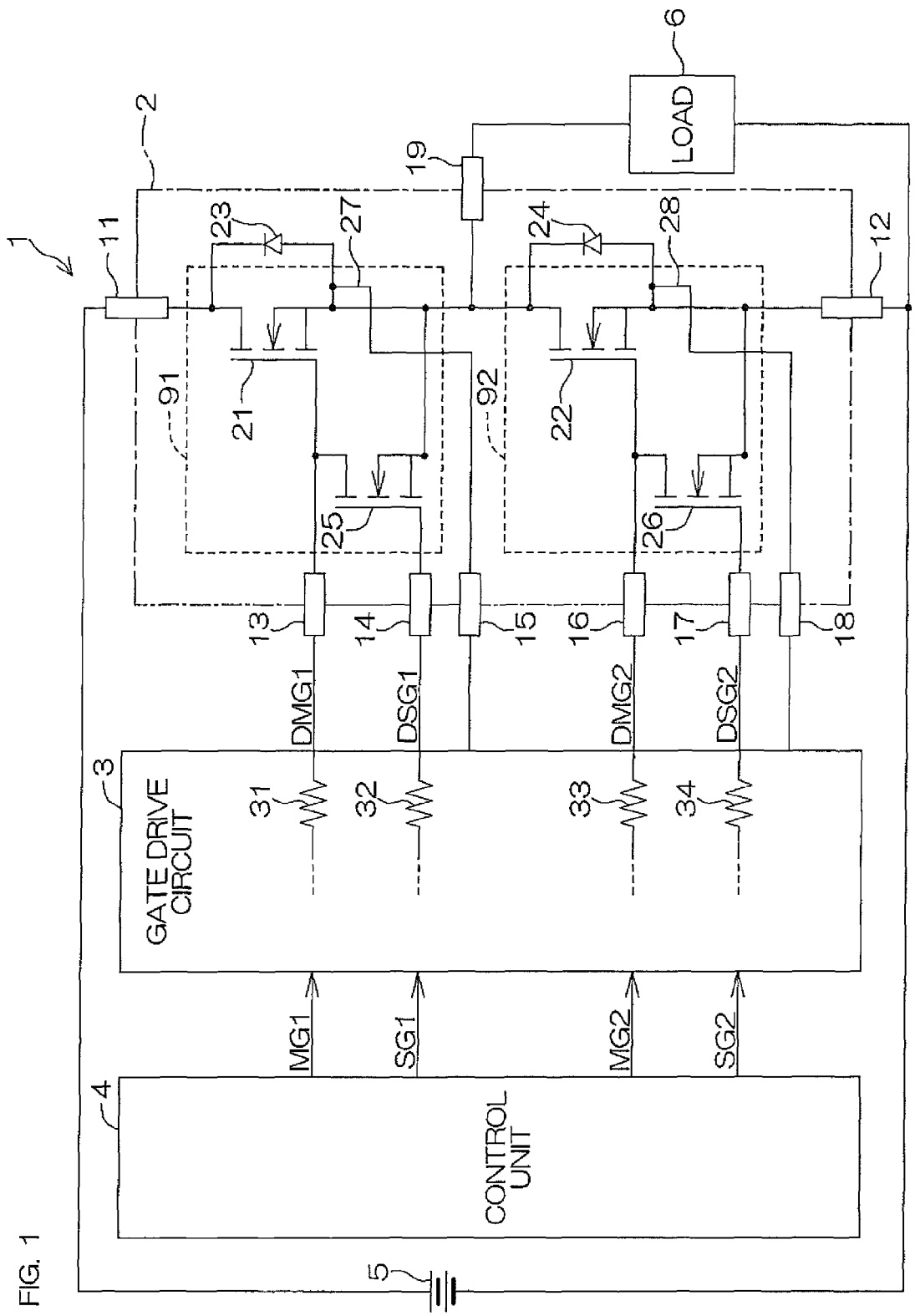
FIG. 1 is an electric circuit diagram showing a half-bridge output circuit that uses a power module according to a first embodiment of the present invention.

FIG. 1 is an electric circuit diagram showing a half-bridge output circuit 1 that uses a power module according to one embodiment of the present invention.

The half-bridge output circuit 1 includes a power module 2, a gate drive circuit 3, and a control unit 4. The power module 2 includes a first power source terminal 11, a second power source terminal (second output terminal) 12, a first main-circuit gate terminal 13, a first short-circuit gate terminal 14, a first source sense terminal 15, a second main-circuit gate terminal 16, a second short-circuit gate terminal 17, a second source sense terminal 18, and a first output terminal 19.

The power module 2 additionally includes a first high-side main-circuit MOSFET (first power switching device) 21 and a second low-side main-circuit MOSFET (second power switching device) 22 connected in series thereto. The main-circuit MOSFETs 21 and 22 are SiC semiconductor devices each of which is made of a semiconducting material composed mainly of SiC (silicon carbide).

A first diode 23 and a second diode 24 are connected in parallel to the first main-circuit MOSFET 21 and the second main-circuit MOSFET 22, respectively. An anode of the first diode 23 is connected to the source of the first main-circuit MOSFET 21, whereas a cathode of the first diode 23 is connected to the drain of the first main-circuit MOSFET 21. An anode of the second diode 24 is connected to the source of the second main-circuit MOSFET 22, whereas a cathode of the second diode 24 is connected to the drain of the second main-circuit MOSFET 22. The first and second diodes 23 and 24 may be built-in diodes that are built into the first main-circuit MOSFET 21 and the second main-circuit MOSFET 22, respectively.

A first short-circuit MOSFET (first gate short-circuit switching device) 25 is connected between the gate and the source of the first main-circuit MOSFET 21. A drain of the first short-circuit MOSFET 25 is connected to the gate of the first main-circuit MOSFET 21, whereas a source of the first short-circuit MOSFET 25 is connected to the source of the first main-circuit MOSFET 21. A second short-circuit MOSFET (second gate short-circuit switching device) 26 is connected between the gate and the source of the second main-circuit MOSFET 22. A drain of the second short-circuit MOSFET 26 is connected to the gate of the second main-circuit MOSFET 22, whereas a source of the second short-circuit MOSFET 26 is connected to the source of the second main-circuit MOSFET 22. The short-circuit MOSFETs 25 and 26 are SiC semiconductor devices each of which is made of a semiconducting material composed mainly of SiC (silicon carbide).

The high-side circuit is formed of the first high-side main-circuit MOSFET 21, the first diode 23, the first short-circuit MOSFET 25, and the terminals 11, 13, 14, and 15. On the other hand, the low-side circuit is formed of the second low-side main-circuit MOSFET 22, the second diode 24, the second short-circuit MOSFET 26, and the terminals 12, 16, 17, and 18.

The drain of the first main-circuit MOSFET 21 is connected to the first power source terminal 11. A connection point at which the source of the first main-circuit MOSFET 21 and the drain of the second main-circuit MOSFET 22 are connected together is connected to the first output terminal 19. The gate of the first main-circuit MOSFET 21 is connected to the first main-circuit gate terminal 13. The gate of the first short-circuit MOSFET 25 is connected to the first short-circuit gate terminal 14. The gate of the second main-circuit MOSFET 22 is connected to the second main-circuit gate terminal 16. The gate of the second short-circuit MOSFET 26 is connected to the second short-circuit gate terminal 17. The source of the second main-circuit MOSFET 22 is connected to the second power source terminal (second output terminal) 12. The first and second main-circuit MOSFETs 21 and 22 include first and second current detecting elements 27 and 28, respectively. The first and second current detecting elements 27 and 28 are connected to the first and second source sense terminals 15 and 18, respectively.

The first power source terminal 11 of the power module 2 is connected to a positive electrode terminal of the power source 5. The second power source terminal (second output terminal) 12 of the power module 2 is connected to a negative electrode terminal of the power source 5. The gate terminals 13, 14, 16, and 17 and the source sense terminals 15 and 18 of the power module 2 are connected to the gate drive circuit 3. The source sense terminals 15 and 18 are connected to, for example, an overcurrent protection circuit (not shown). A load 6 is connected between the first output terminal 19 and the second output terminal (second power source terminal) 12 of the power module 2.

The control unit 4 is a microcomputer composed of a CPU and memories (ROM, RAM, etc.) that preserve its program etc. The control unit 4 generates a first main-circuit gate control signal MG1 with respect to the first main-circuit MOSFET 21, a first short-circuit gate control signal SG1 with respect to the first short-circuit MOSFET 25, a second main-circuit gate control signal MG2 with respect to the second main-circuit MOSFET 22, and a second short-circuit gate control signal SG2 with respect to the second short-circuit MOSFET 26, and gives these signals to the gate drive circuit 3.

Based on the gate control signals MG1, SG1, MG2, and SG2 given by the control unit 4, the gate drive circuit 3 generates and outputs gate drive signals DMG1, DSG1, DMG2, and DSG2 with respect to the first main-circuit MOSFET 21, the first short-circuit MOSFET 25, the second main-circuit MOSFET 22, and the second short-circuit MOSFET 26, respectively. In the present embodiment, each of the gate drive signals DMG1, DSG1, DMG2, and DSG2 becomes an L level if each of the gate control signals MG1, SG1, MG2, and SG2 with respect thereto is at an L level, whereas each of the gate drive signals DMG1, DSG1, DMG2, and DSG2 becomes an H level if each of the gate control signal MG1, SG1, MG2, and SG2 with respect thereto is at an H level.

The gate drive signal DMG1 with respect to the first main-circuit MOSFET 21 is given to the gate of the MOSFET 21 through the gate resistance 31 of the MOSFET 21. The gate drive signal DSG1 with respect to the first short-circuit MOSFET 25 is given to the gate of the MOSFET 25 through the gate resistance 32 of the MOSFET 25. The gate drive signal DMG2 with respect to the second main-circuit MOSFET 22 is given to the gate of the MOSFET 22 through the gate resistance 33 of the MOSFET 22. The gate drive signal DSG2 with respect to the second short-circuit MOSFET 26 is given to the gate of the MOSFET 26 through the gate resistance 34 of the MOSFET 26. Each of the MOSFETs 21, 22, 25, and 26 is turned on when the gate drive signal given to each of the MOSFETs becomes an H level, whereas each is turned off when the gate drive signal given to each becomes an L level.

Figure 2:
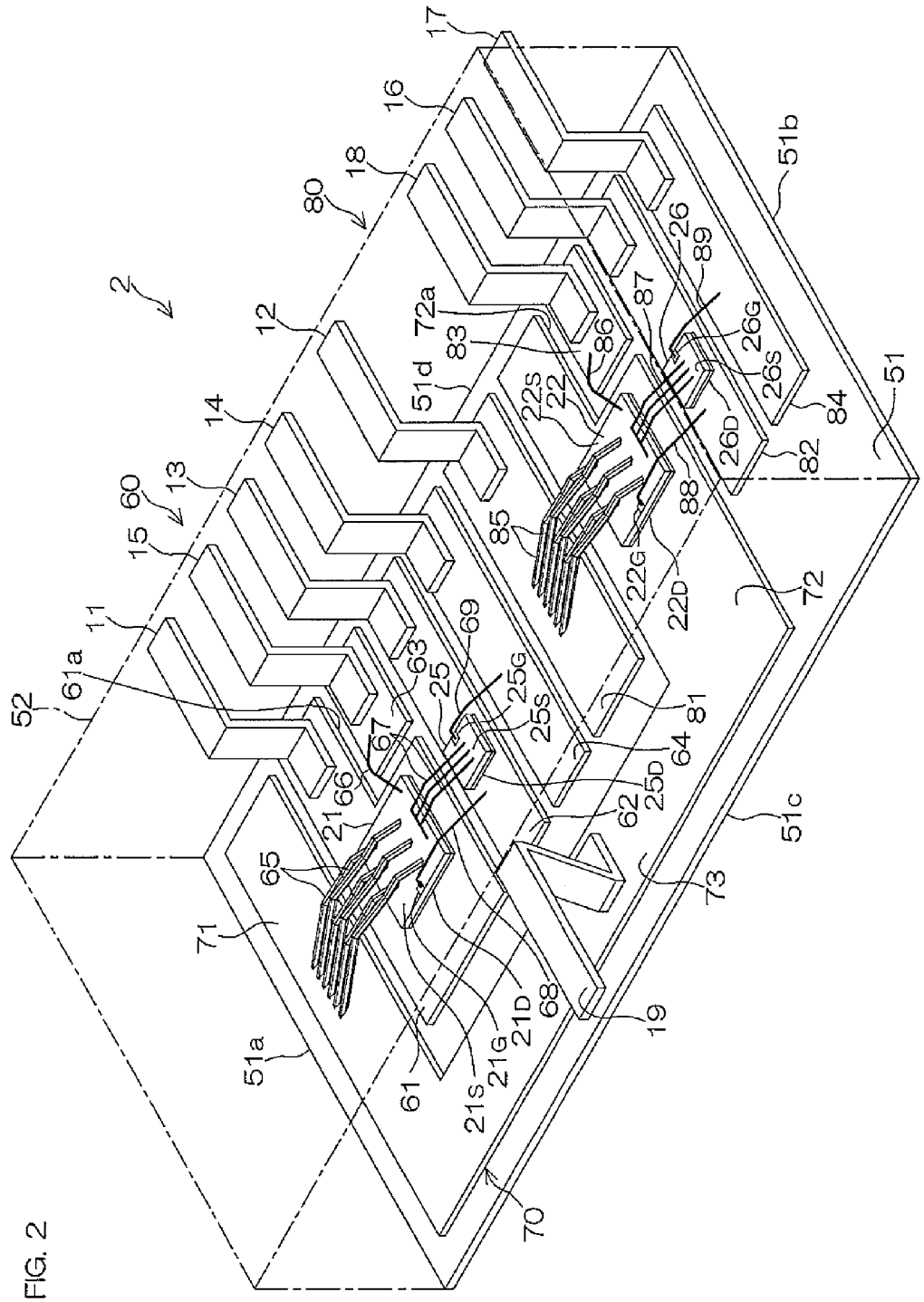
FIG. 2 is a pictorial perspective view showing an internal structure of the power module of FIG. 1.

FIG. 2 is a pictorial perspective view showing an internal structure of the power module 2 of FIG. 1. FIG. 2 shows an example in which the first diode 23 and the second diode 24 are built into the MOSFETs 21 and 22.

The power module 2 includes an insulating substrate 51 and a case 52 fixed to one of the surfaces of the insulating substrate 51. The insulating substrate 51 is formed in the shape of a rectangle that is long in one direction when viewed planarly. The case 52 is formed in a substantially rectangular parallelepiped shape having its lower surface that is opened, and is made of a resin material.

One of two short sides of the insulating substrate 51 is defined as a "first short side 51a" when viewed planarly, whereas the other short side is defined as a "second short side 51b" when viewed planarly. Additionally, one of two long sides of the insulating substrate 51 is defined as a "first long side 51c" when viewed planarly, whereas the other long side is defined as a "second long side 51d" when viewed planarly. Additionally, a direction along the long sides 51c and 51d of the insulating substrate 51 is defined as a "length direction of the insulating substrate 51," whereas a direction along the short sides 51a and 51b of the insulating substrate 51 is defined as a "width direction of the insulating substrate 51."

A first assembly 60 for forming a high-side circuit and a second assembly 80 for forming a low-side circuit are arranged on the insulating substrate 51 side by side in the length direction of the insulating substrate 51. The first assembly 60 is disposed in an area between the center in the length direction of the insulating substrate 51 and the first short side 51a. On the other hand, the second assembly 80 is disposed in an area between the center in the length direction of the insulating substrate 51 and the second short side 51b.

A common land 70 that is used for both the first assembly 60 and the second assembly 80 is formed on the insulating substrate 51. The common land 70 is a plate-like element made of copper or aluminum. The common land 70 is shaped substantially like the letter U when viewed planarly, and includes a first main-circuit source-land portion (arm portion) 71 disposed closer to the first short side 51a of the insulating substrate 51, a second main-circuit drain-land portion (arm portion) 72 disposed closer to the second short side 51b than to the lengthwise center of the insulating substrate 51, and a connection portion 73 through which these arm portions are connected together.

The first main-circuit source-land portion 71 has the shape of a rectangle long in the width direction of the insulating substrate 51 when viewed planarly, and has its long sides disposed along the first short side 51a of the insulating substrate 51. The second main-circuit drain-land portion 72 has a substantially rectangular shape long in the width direction of the insulating substrate 51 when viewed planarly, and is disposed in parallel with the first main-circuit source-land portion 71. The second main-circuit drain-land portion 72 has an excised part 72a at a corner that is near the second long side 51d and the second short side 51b of the insulating substrate 51. The connection portion 73 has the shape of a rectangle long in the length direction of the insulating substrate 51 when viewed planarly, and connects together an end of the first main-circuit source-land portion 71 and an end of the second main-circuit drain-land portion 72 that are their ends located on the side of the first long side 51c of the insulating substrate 51.

The first assembly 60 includes the first main-circuit source-land portion 71, a plurality of lands 61 to 64 formed on the insulating substrate 51 other than the aforementioned lands, the first main-circuit MOSFET 21 (into which the first diode 23 is built), the first short-circuit MOSFET 25, and the terminals 11, 13, 14, and 15. The lands 61 to 64 include a first main-circuit drain-land 61, a first main-circuit gate-land 62, a first source sense-land 63, and a first short-circuit gate-land 64. These lands 61 to 64 are plate-like elements each of which is made of copper or aluminum.

The first main-circuit drain-land 61 has a substantially rectangular shape long in the width direction of the insulating substrate 51 when viewed planarly, and is disposed adjacently to the first main-circuit source-land portion 71 on the side opposite to the first short side 51a of the insulating substrate 51 with respect to the first main-circuit source-land portion 71. The first main-circuit drain-land 61 has an excised part 61a at a corner that is far from the first short side 51a of the insulating substrate 51 and that is near the second long side 51d of the insulating substrate 51 when viewed planarly.

The first main-circuit gate-land 62 has the shape of a rectangle long in the width direction of the insulating substrate 51 when viewed planarly, and is disposed adjacently to the first main-circuit drain-land 61 on the side opposite to the first short side 51a of the insulating substrate 51 with respect to the first main-circuit drain-land 61. The first source sense-land 63 has the shape of a rectangle smaller in length and width than the first main-circuit drain-land 61 when viewed planarly, and is disposed in the excised part 61a of the first main-circuit drain-land 61. The first short-circuit gate-land 64 has the shape of a rectangle long in the width direction of the insulating substrate 51 when viewed planarly, and is disposed adjacently to the first main-circuit gate-land 62 on the side opposite to the first short side 51a of the insulating substrate 51 with respect to the first main-circuit gate-land 62.

A drain electrode $21_D$ of the first main-circuit MOSFET 21 is joined to a surface of the first main-circuit drain-land 61. The first main-circuit MOSFET 21 has a source electrode $21_S$ and a gate electrode $21_G$ on its surface opposite to the first main-circuit drain-land 61. A drain electrode $25_D$ of the first short-circuit MOSFET 25 is joined to a surface of the first main-circuit gate-land 62. The first short-circuit MOSFET 25 has a source electrode $25_S$ and a gate electrode $25_G$ on its surface opposite to the first main-circuit gate-land 62.

The source electrode $21_S$ of the first main-circuit MOSFET 21 is electrically connected to the first main-circuit source-land portion 71 by means of a plurality of bonding wires (connection metal members) 65. Additionally, the source electrode $21_S$ (current detecting element 27) of the first main-circuit MOSFET 21 is electrically connected to the first source sense-land 63 by means of a bonding wire (connection metal member) 66. Still additionally, the source electrode $21_S$ of the first main-circuit MOSFET 21 is electrically connected to the source electrode $25_S$ of the first short-circuit MOSFET 25 by means of a plurality of bonding wires (connection metal members) 67. The gate electrode $21_G$ of the first main-circuit MOSFET 21 is electrically connected to the first main-circuit gate-land 62 by means of a bonding wire (connection metal member) 68. The gate electrode $25_G$ of the first short-circuit MOSFET 25 is electrically connected to the first short-circuit gate-land 64 by means of a bonding wire (connection metal member) 69.

A basal end of the first power source terminal 11 is joined to an end of the surface of the first main-circuit drain-land 61 closer to the second long side 51d of the insulating substrate 51. The first power source terminal 11 is an electrically-conductive plate-like element (which is made, for example, by plating a copper sheet with nickel). The first power source terminal 11 is shaped like a crank when viewed from the length direction of the insulating substrate 51, and has a joined part that is joined to the first main-circuit drain-land 61, an erected part that is united with the joined part, and a connected end part that is united with the erected part. A forward end of the connected end part of the first power source terminal 11 penetrates a side wall of the case 52 located on the side of the second long side 51d of the insulating substrate 51, and protrudes outwardly from the case 52.

A basal end of the first source sense terminal 15 is joined to a part of the surface of the first source sense-land 63 closer to the second long side 51d of the insulating substrate 51. The first source sense terminal 15 is an electrically-conductive plate-like element (which is made, for example, by plating a copper sheet with nickel). The first source sense terminal 15 is shaped like a crank when viewed from the length direction of the insulating substrate 51, and has a joined part that is joined to the first source sense-land 63, an erected part that is united with the joined part, and a connected end part that is united with the erected part. A forward end of the connected end part of the first source sense terminal 15 penetrates a side wall of the case 52 located on the side of the second long side 51d of the insulating substrate 51, and protrudes outwardly from the case 52.

A basal end of the first main-circuit gate terminal 13 is joined to an end of the surface of the first main-circuit gate-land 62 closer to the second long side 51d of the insulating substrate 51. The first main-circuit gate terminal 13 is shaped like a crank when viewed from the length direction of the insulating substrate 51, and is an electrically-conductive plate-like element (which is made, for example, by plating a copper sheet with nickel). The first main-circuit gate terminal 13 has a joined part that is joined to the first main-circuit gate-land 62, an erected part that is united with the joined part, and a connected end part that is united with the erected part. A forward end of the connected end part of the first main-circuit gate terminal 13 penetrates a side wall of the case 52 located on the side of the second long side 51d of the insulating substrate 51, and protrudes outwardly from the case 52.

A basal end of the first short-circuit gate terminal 14 is joined to an end of the surface of the first short-circuit gate-land 64 closer to the second long side 51d of the insulating substrate 51. The first short-circuit gate terminal 14 is an electrically-conductive plate-like element (which is made, for example, by plating a copper sheet with nickel). The first short-circuit gate terminal 14 is shaped like a crank when viewed from the length direction of the insulating substrate 51, and has a joined part that is joined to the first short-circuit gate-land 64, an erected part that is united with the joined part, and a connected end part that is united with the erected part. A forward end of the connected end part of the first short-circuit gate terminal 14 penetrates a side wall of the case 52 located on the side of the second long side 51d of the insulating substrate 51, and protrudes outwardly from the case 52.

The second assembly 80 includes the second main-circuit drain-land portion 72, a plurality of lands 81 to 84 formed on the insulating substrate 51 other than the aforementioned lands, the second main-circuit MOSFET 22 (into which the second diode 24 is built), the second short-circuit MOSFET 26, and the terminals 12, 16, 17, and 18. The lands 81 to 84 include a second main-circuit source-land 81, a second main-circuit gate-land 82, a second source sense-land 83, and a second short-circuit gate-land 84. These lands 81 to 84 are plate-like elements each of which is made of copper or aluminum.

The second main-circuit source-land 81 has the shape of a rectangle long in the width direction of the insulating substrate 51 when viewed planarly, and is disposed between the first short-circuit gate-land 64 and the second main-circuit drain-land portion 72.

The second main-circuit gate-land 82 has the shape of a rectangle long in the width direction of the insulating substrate 51 when viewed planarly, and is disposed adjacently to the second main-circuit drain-land portion 72 on the side of the second short side 51b of the insulating substrate 51 with respect to the second main-circuit drain-land portion 72. The second source sense-land 83 has the shape of a rectangle smaller in length and width than the second main-circuit drain-land portion 72 when viewed planarly, and is disposed in the excised part 72a of the second main-circuit drain-land portion 72. The second short-circuit gate-land 84 has the shape of a rectangle long in the width direction of the insulating substrate 51 when viewed planarly, and is disposed between the second main-circuit gate-land 82 and the second short side 51b of the insulating substrate 51.

A drain electrode $22_D$ of the second main-circuit MOSFET 22 is joined to a surface of the second main-circuit drain-land portion 72. The second main-circuit MOSFET 22 has a source electrode $22_S$ and a gate electrode $22_G$ on its surface opposite to the second main-circuit drain-land portion 72. A drain electrode $26_D$ of the second short-circuit MOSFET 26 is joined to a surface of the second main-circuit gate-land 82. The second short-circuit MOSFET 26 has a source electrode $26_S$ and a gate electrode $26_G$ on its surface opposite to the second main-circuit gate-land 82.

The source electrode $22_S$ of the second main-circuit MOSFET 22 is electrically connected to the second main-circuit source-land 81 by means of a plurality of bonding wires (connection metal members) 85. Additionally, the source electrode $22_S$ (current detecting element 28) of the second main-circuit MOSFET 22 is electrically connected to the second source sense-land 83 by means of a bonding wire (connection metal member) 86. Still additionally, the source electrode $22_S$ of the second main-circuit MOSFET 22 is electrically connected to the source electrode $26_S$ of the second short-circuit MOSFET 26 by means of a plurality of bonding wires (connection metal members) 87. The gate electrode $22_G$ of the second main-circuit MOSFET 22 is electrically connected to the second main-circuit gate-land 82 by means of a bonding wire (connection metal member) 88. The gate electrode $26_G$ of the second short-circuit MOSFET 26 is electrically connected to the second short-circuit gate-land 84 by means of a bonding wire (connection metal member) 89.

A basal end of the second power source terminal 12 is joined to an end of the surface of the second main-circuit source-land 81 closer to the second long side 51d of the insulating substrate 51. The second power source terminal 12 is an electrically-conductive plate-like element (which is made, for example, by plating a copper sheet with nickel). The second power source terminal 12 is shaped like a crank when viewed from the length direction of the insulating substrate 51, and has a joined part that is joined to the second main-circuit source-land 81, an erected part that is united with the joined part, and a connected end part that is united with the erected part. A forward end of the connected end part of the second power source terminal 12 penetrates a side wall of the case 52 located on the side of the second long side 51d of the insulating substrate 51, and protrudes outwardly from the case 52.

A basal end of the second source sense terminal 18 is joined to a part of the surface of the second source sense-land 83 closer to the second long side 51d of the insulating substrate 51. The second source sense terminal 18 is an electrically-conductive plate-like element (which is made, for example, by plating a copper sheet with nickel). The second source sense terminal 18 is shaped like a crank when viewed from the length direction of the insulating substrate 51, and has a joined part that is joined to the second source sense-land 83, an erected part that is united with the joined part, and a connected end part that is united with the erected part. A forward end of the connected end part of the second source sense terminal 18 penetrates a side wall of the case 52 located on the side of the second long side 51d of the insulating substrate 51, and protrudes outwardly from the case 52.

A basal end of the second main-circuit gate terminal 16 is joined to an end of the surface of the second main-circuit gate-land 82 closer to the second long side 51d of the insulating substrate 51. The second main-circuit gate terminal 16 is shaped like a crank when viewed from the length direction of the insulating substrate 51, and is an electrically-conductive plate-like element (which is made, for example, by plating a copper sheet with nickel). The second main-circuit gate terminal 16 has a joined part that is joined to the second main-circuit gate-land 82, an erected part that is united with the joined part, and a connected end part that is united with the erected part. A forward end of the connected end part of the second main-circuit gate terminal 16 penetrates a side wall of the case 52 located on the side of the second long side 51d of the insulating substrate 51, and protrudes outwardly from the case 52.

A basal end of the second short-circuit gate terminal 17 is joined to an end of the surface of the second short-circuit gate-land 84 closer to the second long side 51d of the insulating substrate 51. The second short-circuit gate terminal 17 is an electrically-conductive plate-like element (which is made, for example, by plating a copper sheet with nickel). The second short-circuit gate terminal 17 is shaped like a crank when viewed from the length direction of the insulating substrate 51, and has a joined part that is joined to the second short-circuit gate-land 84, an erected part that is united with the joined part, and a connected end part that is united with the erected part. A forward end of the connected end part of the second short-circuit gate terminal 17 penetrates a side wall of the case 52 located on the side of the second long side 51d of the insulating substrate 51, and protrudes outwardly from the case 52.

A basal end of the first output terminal 19 is joined to the lengthwise center of the surface of the connection portion 73 of the common land 70. The first output terminal 19 is an electrically-conductive plate-like element (which is made, for example, by plating a copper sheet with nickel). The first output terminal 19 is shaped like a crank when viewed from the length direction of the insulating substrate 51, and has a joined part that is joined to the connection portion 73, an erected part that is united with the joined part, and a connected end part that is united with the erected part. A forward end of the connected end part of the first output terminal 19 penetrates a side wall of the case 52 located on the side of the first long side 51c of the insulating substrate 51, and protrudes outwardly from the case 52.

For example, a substrate (DBC: Direct Bonding Copper) in which a copper foil is bonded directly to ceramics may be used instead of the insulating substrate 51. If so, the lands 61 to 64, 70, and 81 to 84 can be formed by the copper foil.

Figure 3:
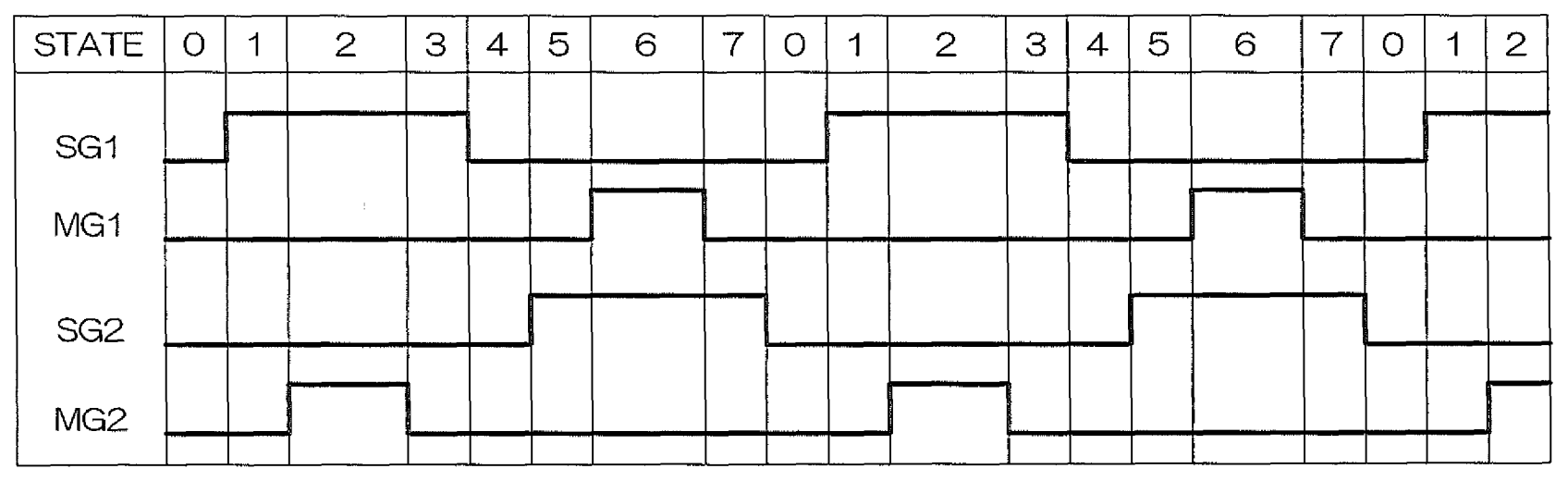

FIG. 3 is a time chart showing each gate control signal generated by the control unit 4.

In an example of FIG. 3, States 0 to 7 exist as states in which the gate control signals are combined with each other, and States 0 to 7 are repeatedly performed.

In State 0, all of the first main-circuit gate control signal MG1, the first short-circuit gate control signal SG1, the second main-circuit gate control signal MG2, and the second short-circuit gate control signal SG2 are at the L level. Therefore, all of the first main-circuit MOSFET 21, the first short-circuit MOSFET 25, the second main-circuit MOSFET 22, and the second short-circuit MOSFET 26 are in an off state.

In State 1, the first short-circuit gate control signal SG1 is inverted from the L level to the H level. As a result, the first high-side short-circuit MOSFET 25 is turned on. As a result, the gate-to-source portion of the first high-side main-circuit MOSFET 21 is short-circuited by the first short-circuit MOSFET 25.

In State 2, the second main-circuit gate control signal MG2 is inverted from the L level to the H level. As a result, the second low-side main-circuit MOSFET 22 is turned on. When the second low-side main-circuit MOSFET 22 is turned on, a power source voltage is applied to the first high-side main-circuit MOSFET 21, and therefore the drain-to-source voltage $V_{DS}$ of the first main-circuit MOSFET 21 rises rapidly. Therefore, a displacement current $I_{DG}$ flows from the drain of the first main-circuit MOSFET 21 to the gate. The displacement current $I_{DG}$ is expressed as $I_{DG}=C_{DG}\cdot dV_{DG}/dt$ wherein $V_{DG}$ designates the drain-to-gate voltage of the first main-circuit MOSFET 21, and $C_{DG}$ designates the drain-to-gate parasitic capacitance of the first main-circuit MOSFET 21. The value $dV_{DG}/dt$ is determined by rise time (tr) when the second main-circuit MOSFET 22 is turned on.

At this time, in the present embodiment, the gate-to-source portion of the first main-circuit MOSFET 21 is short-circuited by the first short-circuit MOSFET 25. Therefore, the displacement current $I_{DG}$ that has flowed from the drain of the first main-circuit MOSFET 21 to the gate flows through the first short-circuit MOSFET 25, the source of the first main-circuit MOSFET 21, and the second main-circuit MOSFET 22, and flows to the earth. Therefore, the displacement current $I_{DG}$ does not flow to the gate resistance 31 of the first main-circuit MOSFET 21. Additionally, the gate-to-source portion of the first main-circuit MOSFET 21 is short-circuited by the first short-circuit MOSFET 25, and therefore an increase in the gate-to-source voltage $V_{GS}$ of the first main-circuit MOSFET 21 can be restrained or prevented.

In State 3, the second main-circuit gate control signal MG2 is inverted from the H level to the L level. As a result, the second low-side main-circuit MOSFET 22 is turned off.

In State 4, the first short-circuit gate control signal SG1 is inverted from the H level to the L level. As a result, the first short-circuit MOSFET 25 is turned off.

In State 5, the second short-circuit gate control signal SG2 is inverted from the L level to the H level. As a result, the second low-side short-circuit MOSFET 26 is turned on. As a result, the gate-to-source portion of the second low-side main-circuit MOSFET 22 is short-circuited by the second short-circuit MOSFET 26.

In State 6, the first main-circuit gate control signal MG1 is inverted from the L level to the H level. As a result, the first high-side main-circuit MOSFET 21 is turned on. When the first high-side main-circuit MOSFET 21 is turned on, a power source voltage is applied to the second low-side main-circuit MOSFET 22, and therefore the drain-to-source voltage $V_{DS}$ of the second low-side main-circuit MOSFET 22 rises rapidly. Therefore, a displacement current $I_{DG}$ flows from the drain of the second main-circuit MOSFET 22 to the gate. The displacement current $I_{DG}$ is expressed as $I_{DG}=C_{DG}\cdot dV_{DG}/dt$ wherein $V_{DG}$ designates the drain-to-gate voltage of the second main-circuit MOSFET 22, and $C_{DG}$ designates the drain-to-gate parasitic capacitance of the second main-circuit MOSFET 22. The value $dV_{DG}/dt$ is determined by rise time (tr) when the first main-circuit MOSFET 21 is turned on.

At this time, in the present embodiment, the gate-to-source portion of the second main-circuit MOSFET 22 is short-circuited by the second short-circuit MOSFET 26. Therefore, the displacement current $I_{DG}$ that has flowed from the drain of the second main-circuit MOSFET 22 to the gate flows through the second short-circuit MOSFET 26 and the source of the second main-circuit MOSFET 22, and flows to the earth. Therefore, the displacement current $I_{DG}$ does not flow to the gate resistance 33 of the second main-circuit MOSFET 22. Additionally, the gate-to-source portion of the second main-circuit MOSFET 22 is short-circuited by the second short-circuit MOSFET 26, and therefore an increase in the gate-to-source voltage $V_{GS}$ of the second main-circuit MOSFET 22 can be restrained or prevented.

In State 7, the first main-circuit gate control signal MG1 is inverted from the H level to the L level. As a result, the first high-side main-circuit MOSFET 21 is turned off.

In State 0 subsequent to State 7, the second short-circuit gate control signal SG2 is inverted from the H level to the L level. As a result, the second low-side short-circuit MOSFET 26 is turned off.

A description will be given of timing conditions under which the first short-circuit gate signal SG1 and the second short-circuit gate signal SG2 are turned on or off. Timing at which the first short-circuit gate signal SG1 is turned on is required to be set shortly before the second main-circuit gate signal MG2 is inverted from the L level to the H level (shortly before the second main-circuit MOSFET 22 is turned on). Timing at which the first short-circuit gate signal SG1 is turned off is required to be set after a predetermined period of time more than a period of time during which the drain-to-source voltage of the first main-circuit MOSFET 21 rises (e.g., more than 200 nsec) elapses after the second main-circuit gate signal MG2 is inverted from the L level to the H level (after the second main-circuit MOSFET 22 is turned on). Additionally, timing at which the first short-circuit gate signal SG1 is turned off is required to be set before the first main-circuit gate signal MG1 is inverted from the L level to the H level (before the first main-circuit MOSFET 21 is turned on).

Timing at which the second short-circuit gate signal SG2 is turned on is required to be set shortly before the first main-circuit gate signal MG1 is inverted from the L level to the H level (shortly before the first main-circuit MOSFET 21 is turned on). Timing at which the second short-circuit gate signal SG2 is turned off is required to be set after a predetermined period of time more than a period of time during which the drain-to-source voltage of the second main-circuit MOSFET 22 rises (e.g., more than 200 nsec) elapses after the first main-circuit gate signal MG1 is inverted from the L level to the H level (after the first main-circuit MOSFET 21 is turned on). Additionally, timing at which the second short-circuit gate signal SG2 is turned off is required to be set before the second main-circuit gate signal MG2 is inverted from the L level to the H level (before the second main-circuit MOSFET 22 is turned on).

It is to be noted that a penetration current flows when the first main-circuit MOSFET 21 and the second main-circuit MOSFET 22 are simultaneously turned on. Therefore, in order to stop the penetration current, a dead time is provided after the first main-circuit gate signal MG1 is inverted from the H level to the L level (after the first main-circuit MOSFET 21 is turned off) until the second main-circuit gate signal MG2 is inverted from the L level to the H level (until the second main-circuit MOSFET 22 is turned on). Likewise, a dead time is provided after the second main-circuit gate signal MG2 is inverted from the H level to the L level (after the second main-circuit MOSFET 22 is turned off) until the first main-circuit gate signal MG1 is inverted from the L level to the H level (until the first main-circuit MOSFET 21 is turned on). In other words, the first main-circuit MOSFET 21 and the second main-circuit MOSFET 22 are alternately turned on with a dead time between the respective ON states.

Although the embodiment of the present invention has been described as above, the present invention can be embodied in another form. For example, in the above embodiment, the terminals 11 to 19 are formed to be equal in the cross-sectional area to each other, and yet the first power source terminal 11, the second power source terminal (second output terminal) 12, and the first output terminal 19 through which a larger electric current flows than the terminals 13, 14, 15, 16, 17, and 18 may be formed to be greater in the cross-sectional area than the other terminals 13, 14, 15, 16, 17, and 18.

Figure 4:
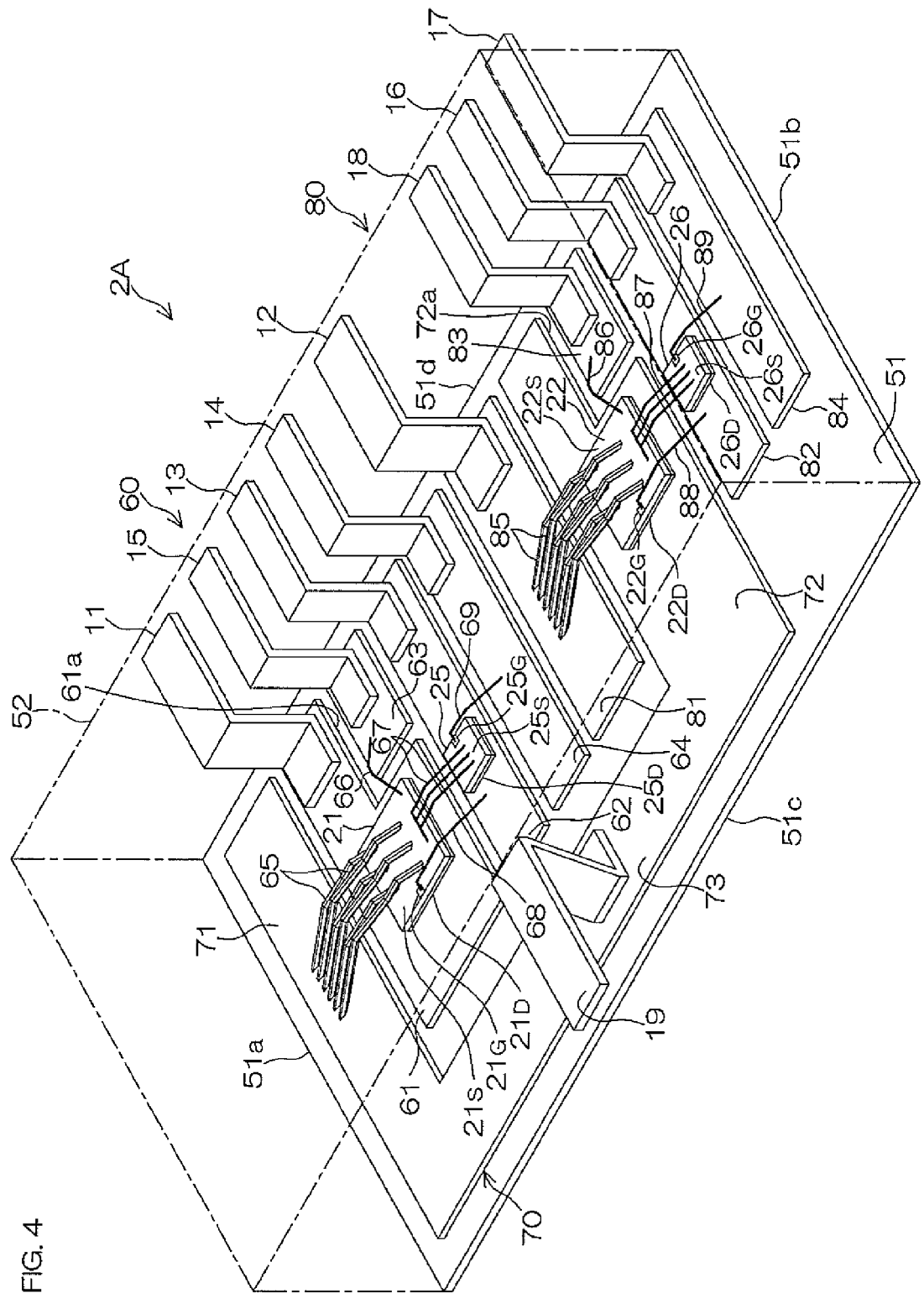
FIG. 4 is a pictorial perspective view showing another example of the power module.

FIG. 4 is a pictorial perspective view showing an example of a power module in which the terminals 11, 12, and 19 are formed to be greater in the cross-sectional area than the other terminals 13, 14, 15, 16, 17, and 18. In this power module 2A, the first power source terminal 11, the second power source terminal 12, and the first output terminal 19 are formed to be greater in width than the other terminals 13, 14, 15, 16, 17, and 18.

The terminals 11, 12, and 19 may be formed to be greater in thickness than the other terminals 13, 14, 15, 16, 17, and 18. Additionally, the terminals 11, 12, and 19 may be formed to be greater in both width and thickness than the other terminals 13, 14, 15, 16, 17, and 18.

Additionally, the short-circuit MOSFETs 25 and 26 are not necessarily required to be mounted on the insulating substrate 51 although, in the above embodiment, the short-circuit MOSFETs 25 and 26 are mounted on the insulating substrate 51 on which the main-circuit MOSFETs 21 and 22 are mounted. For example, a chip in which the first short-circuit MOSFET 25 is formed may be disposed inside or outside the case 51, and may be connected between the terminal (main-circuit gate terminal 13) to which the gate electrode of the first main-circuit MOSFET 21 is connected and the terminal (first source sense terminal 15 or first output terminal 19) to which the source electrode of the first main-circuit MOSFET 21 is connected. More specifically, a drain terminal of a chip in which the first short-circuit MOSFET 25 is formed may be electrically connected to the main-circuit gate terminal 13 by means of a conductive wire such as a lead wire, and a source terminal of this chip may be connected to the first source sense terminal 15 or to the first output terminal 19 by means of a conductive wire such as a lead wire. If the chip is disposed inside the case 51, a lead may be connected to the gate terminal of the chip, and may be drawn from the case 51 outwardly.

Likewise, a chip in which the second short-circuit MOSFET 26 is formed may be disposed inside or outside the case 51, and may be connected between the terminal (main-circuit gate terminal 16) to which the gate electrode of the second main-circuit MOSFET 22 is connected and the terminal (second source sense terminal 18 or second output terminal 12) to which the source electrode of the second main-circuit MOSFET 22 is connected. More specifically, a drain terminal of a chip in which the second short-circuit MOSFET 26 is formed may be electrically connected to the main-circuit gate terminal 16 by means of a conductive wire such as a lead wire, and a source terminal of this chip may be connected to the second source sense terminal 18 or to the second output terminal 12 by means of a conductive wire such as a lead wire. If the chip is disposed inside the case 51, a lead may be connected to the gate terminal of the chip, and may be drawn from the case 51 outwardly.

Figure 5:
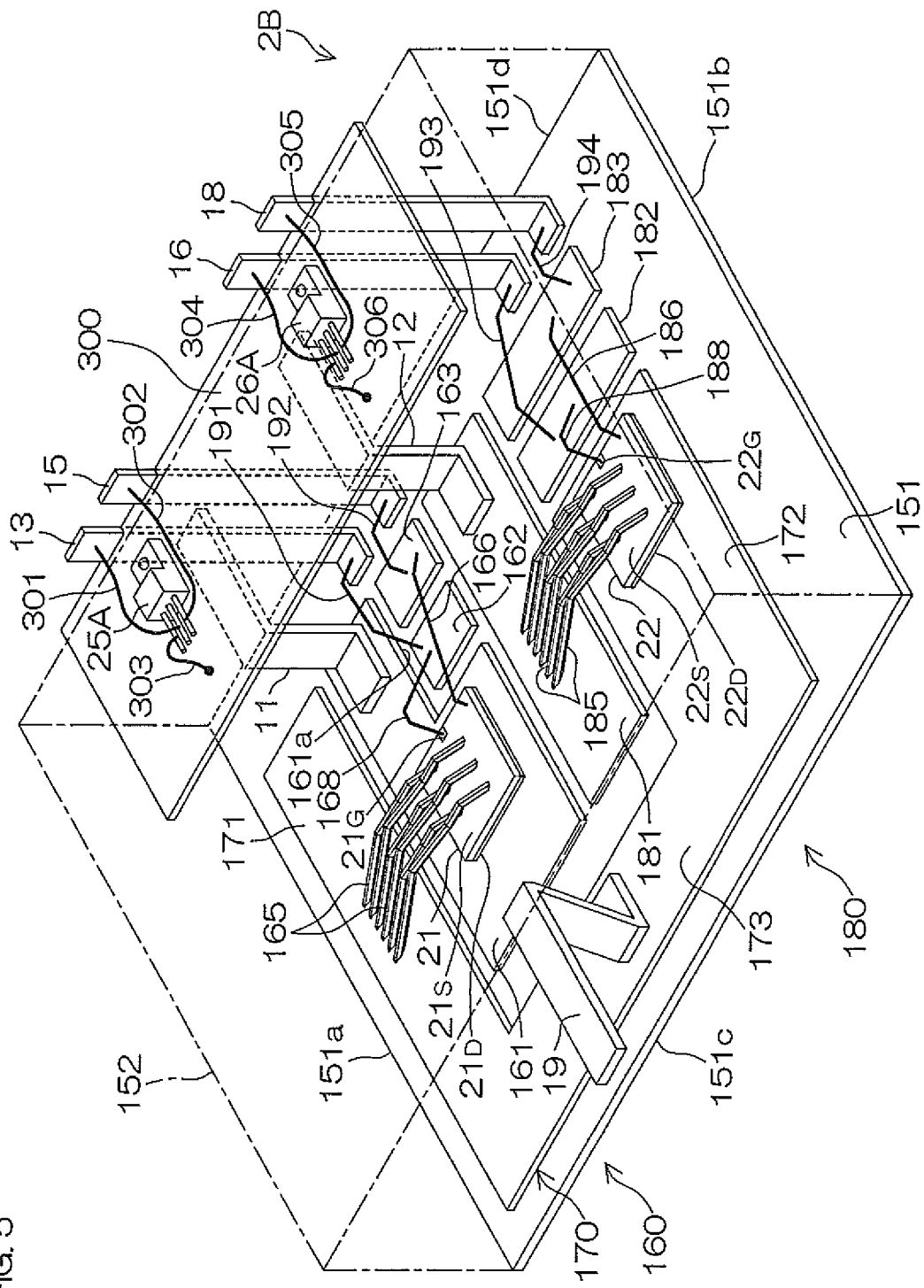
FIG. 5 is a pictorial perspective view showing a specific example of an instance in which a chip in which a first short-circuit MOSFET is formed and a chip in which a second short-circuit MOSFET is formed are connected to module terminals outside a case of the power module.

FIG. 5 is a pictorial perspective view showing a specific example when the chip in which the first short-circuit MOSFET 25 is formed and the chip in which the second short-circuit MOSFET 26 is formed are connected to module terminals outside the case of the power module. FIG. 5 shows an example in which the first diode 23 and the second diode 24 are built into the MOSFETs 21 and 22.

The power module 2B includes an insulating substrate 151 and a case 152 fixed to one of the surfaces of the insulating substrate 151. The insulating substrate 151 is formed in the shape of a rectangle that is long in one direction when viewed planarly. The case 152 is formed in a substantially rectangular parallelepiped shape having its lower surface that is opened, and is made of a resin material. A gate drive circuit mounting board 300 on which the gate drive circuit 3 is mounted is disposed above the case 152.

In the present embodiment, the first short-circuit MOSFET 25 and the second short-circuit MOSFET 26 are not formed in the power module 2B. The chip 25A in which the first short-circuit MOSFET 25 is formed and the chip 26A in which the second short-circuit MOSFET 26 is formed are mounted on the gate drive circuit mounting board 300.

One of two short sides of the insulating substrate 151 is defined as a "first short side 151a" when viewed planarly, whereas the other short side is defined as a "second short side 151b" when viewed planarly. Additionally, one of two long sides of the insulating substrate 151 is defined as a "first long side 151c" when viewed planarly, whereas the other long side is defined as a "second long side 151d" when viewed planarly. Additionally, a direction along the long sides 151c and 151d of the insulating substrate 151 is defined as a "length direction of the insulating substrate 151," whereas a direction along the short sides 151a and 151b of the insulating substrate 151 is defined as a "width direction of the insulating substrate 151."

A first assembly 160 for forming a high-side circuit exclusive of the first short-circuit MOSFET 25 and a second assembly 180 for forming a low-side circuit exclusive of the second short-circuit MOSFET 26 are arranged on the insulating substrate 151 side by side in the length direction of the insulating substrate 151. The first assembly 160 is disposed in an area between the center in the length direction of the insulating substrate 151 and the first short side 151a. On the other hand, the second assembly 180 is disposed in an area between the center in the length direction of the insulating substrate 151 and the second short side 151b.

A common land 170 that is used for both the first assembly 160 and the second assembly 180 is formed on the insulating substrate 151. The common land 170 is a plate-like element made of copper or aluminum. The common land 170 is shaped substantially like the letter U when viewed planarly, and includes a first main-circuit source-land portion (arm portion) 171 disposed closer to the first short side 151a of the insulating substrate 151, a second main-circuit drain-land portion (arm portion) 172 disposed closer to the second short side 151b than to the lengthwise center of the insulating substrate 151, and a connection portion 173 by which these arm portions are connected together.

The first main-circuit source-land portion 171 has the shape of a rectangle long in the width direction of the insulating substrate 151 when viewed planarly, and has its long sides disposed along the first short side 151a of the insulating substrate 151. The second main-circuit drain-land portion 172 has a substantially rectangular shape long in the width direction of the insulating substrate 151 when viewed planarly, and is disposed in parallel with the first main-circuit source-land portion 171. The second main-circuit drain-land portion 172 is formed to be shorter in length than the first main-circuit source-land portion 171.

The connection portion 173 has the shape of a rectangle long in the length direction of the insulating substrate 151 when viewed planarly, and connects together an end of the first main-circuit source-land portion 171 and an end of the second main-circuit drain-land portion 172 that are their ends located on the side of the first long side 151c of the insulating substrate 151.

The first assembly 160 includes the first main-circuit source-land portion 171, a plurality of lands 161 to 163 formed on the insulating substrate 151 other than the aforementioned lands, the first main-circuit MOSFET 21 (into which the first diode 23 is built), and the terminals 11, 13, and 15. The lands 161 to 163 include a first main-circuit drain-land 161, a first main-circuit gate-land 162, and a first source sense-land 163. These lands 161 to 163 are plate-like elements each of which is made of copper or aluminum.

The first main-circuit drain-land 161 has a substantially rectangular shape long in the width direction of the insulating substrate 151 when viewed planarly, and is disposed adjacently to the first main-circuit source-land portion 171 on the side opposite to the first short side 151a of the insulating substrate 151 with respect to the first main-circuit source-land portion 171. The first main-circuit drain-land 161 has an excised part 161a at a corner that is far from the first short side 151a of the insulating substrate 151 and that is near the second long side 151d of the insulating substrate 151 when viewed planarly.

The first main-circuit gate-land 162 has a substantially rectangular shape long in the length direction of the insulating substrate 151 when viewed planarly, and has a length shorter than the width of the first main-circuit drain-land 161. The first main-circuit gate-land 162 is disposed in the excised part 161a of the first main-circuit drain-land 161.

The first source sense-land 163 has a substantially rectangular shape long in the length direction of the insulating substrate 151 when viewed planarly, and has a length shorter than the width of the first main-circuit drain-land 161. The first source sense-land 163 is disposed adjacently to the first main-circuit gate-land 162 on the side opposite to the first long side 151c of the insulating substrate 151 with respect to the first main-circuit gate-land 162 in the excised part 161a of the first main-circuit drain-land 161.

The first main-circuit gate terminal 13 and the first source sense terminal 15 are disposed with an interval between these terminals 13 and 15 in the length direction of the insulating substrate 151 between the first main-circuit drain-land 161 and the second long side 151d of the insulating substrate 151 and between the first source sense-land 163 and the second long side 151d of the insulating substrate 151. The first main-circuit gate terminal 13 is an electrically-conductive plate-like element. The first main-circuit gate terminal 13 is shaped substantially like the letter L when viewed from the length direction of the insulating substrate 151, and has a fixed part that is fixed to the insulating substrate 151 and an erected part that is united with the fixed part. A forward end of the erected part of the first main-circuit gate terminal 13 penetrates an upper wall of the case 152, and extends outwardly from the case 152, and protrudes upwardly from the gate drive circuit mounting board 300 through a cutout part formed in a lateral portion of the board 300.

The first source sense terminal 15 is an electrically-conductive plate-like element. The first source sense terminal 15 is shaped substantially like the letter L when viewed from the length direction of the insulating substrate 151, and has a fixed part that is fixed to the insulating substrate 151 and an erected part that is united with the fixed part. A forward end of the erected part of the first source sense terminal 15 penetrates the upper wall of the case 152, and extends outwardly from the case 152, and protrudes upwardly from the gate drive circuit mounting board 300 through a cutout part formed in the lateral portion of the board 300.

A drain electrode $21_D$ of the first main-circuit MOSFET 21 is joined to a surface of the first main-circuit drain-land 161. The first main-circuit MOSFET 21 has a source electrode $21_S$ and a gate electrode $21_G$ on its surface opposite to the first main-circuit drain-land 161.

The source electrode $21_S$ of the first main-circuit MOSFET is electrically connected to the first main-circuit source-land portion 171 by means of a plurality of bonding wires (connection metal members) 165. Additionally, the source electrode $21_S$ (current detecting element 27) of the first main-circuit MOSFET 21 is electrically connected to the first source sense-land 163 by means of a bonding wire (connection metal member) 166. The gate electrode $21_G$ of the first main-circuit MOSFET 21 is electrically connected to the first main-circuit gate-land 162 by means of a bonding wire (connection metal member) 168.

A basal end of the first power source terminal 11 is joined to an end of the surface of the first main-circuit drain-land 161 closer to the second long side 151d of the insulating substrate 151. The first power source terminal 11 is an electrically-conductive plate-like element. The first power source terminal 11 is shaped like a crank when viewed from the length direction of the insulating substrate 151 in the same way as the first power source terminal 11 shown in FIG. 2. A forward end of the first power source terminal 11 penetrates a side wall of the case 152 located on the side of the second long side 151d of the insulating substrate 151, and protrudes outwardly from the case 152.

The first main-circuit gate-land 162 is electrically connected to the first main-circuit gate terminal 13 by means of a bonding wire 191. The first source sense-land 163 is connected to the first source sense terminal 15 by means of a bonding wire 192.

The second assembly 180 includes the second main-circuit drain-land portion 172, a plurality of lands 181 to 183 formed on the insulating substrate 151 other than the aforementioned lands, the second main-circuit MOSFET 22 (into which the second diode 24 is built), and the terminals 12, 16, and 18. The lands 181 to 183 include a second main-circuit source-land 181, a second main-circuit gate-land 182, and a second source sense-land 183. These lands 181 to 183 are plate-like elements each of which is made of copper or aluminum.

The second main-circuit source-land 181 has the shape of a rectangle long in the width direction of the insulating substrate 151 when viewed planarly, and is disposed between the first main-circuit drain-land 161 and the second main-circuit drain-land portion 172.

The second main-circuit gate-land 182 has a substantially rectangular shape long in the length direction of the insulating substrate 151 when viewed planarly, and has a length substantially equal to the width of the second main-circuit drain-land portion 172. The second main-circuit gate-land 182 is disposed adjacently to the second main-circuit drain-land portion 172 on the side opposite to the first long side 151c of the insulating substrate 151 with respect to the second main-circuit drain-land portion 172.

The second source sense-land 183 has a substantially rectangular shape long in the length direction of the insulating substrate 151 when viewed planarly, and has a length substantially equal to the width of the second main-circuit drain-land portion 172. The second source sense-land 183 is disposed adjacently to the second main-circuit gate-land 182 on the side opposite to the first long side 151c of the insulating substrate 151 with respect to the second main-circuit gate-land 182.

The second main-circuit gate terminal 16 and the second source sense terminal 18 are disposed with an interval therebetween in the length direction of the insulating substrate 151 between the second source sense-land 183 and the second long side 151d of the insulating substrate 151. The second main-circuit gate terminal 16 is an electrically-conductive plate-like element. The second main-circuit gate terminal 16 is shaped substantially like the letter L when viewed from the length direction of the insulating substrate 151, and has a fixed part that is fixed to the insulating substrate 151 and an erected part that is united with the fixed part. A forward end of the erected part of the second main-circuit gate terminal 16 penetrates the upper wall of the case 152, and extends outwardly from the case 152, and protrudes upwardly from the gate drive circuit mounting board 300 through a cutout part formed in the lateral portion of the board 300.

The second source sense terminal 18 is an electrically-conductive plate-like element. The second source sense terminal 18 is shaped substantially like the letter L when viewed from the length direction of the insulating substrate 151, and has a fixed part that is fixed to the insulating substrate 151 and an erected part that is united with the fixed part. A forward end of the erected part of the second source sense terminal 18 penetrates the upper wall of the case 152, and extends outwardly from the case 152, and protrudes upwardly from the gate drive circuit mounting board 300 through a cutout part formed in the lateral portion of the board 300.

A drain electrode $22_D$ of the second main-circuit MOSFET 22 is joined to a surface of the second main-circuit drain-land portion 172. The second main-circuit MOSFET 22 has a source electrode $22_S$ and a gate electrode $22_G$ on its surface opposite to the second main-circuit drain-land portion 172.

The source electrode $22_S$ of the second main-circuit MOSFET is electrically connected to the second main-circuit source-land 181 by means of a plurality of bonding wires (connection metal members) 185. Additionally, the source electrode $22_S$ (current detecting element 28) of the second main-circuit MOSFET 22 is electrically connected to the second source sense-land 183 by means of a bonding wire (connection metal member) 186. The gate electrode $22_G$ of the second main-circuit MOSFET 22 is electrically connected to the second main-circuit gate-land 182 by means of a bonding wire (connection metal member) 188.

A basal end of the second power source terminal 12 is joined to an end of the surface of the second main-circuit source-land 181 closer to the second long side 151d of the insulating substrate 151. The second power source terminal 12 is an electrically-conductive plate-like element. The second power source terminal 12 is shaped like a crank when viewed from the length direction of the insulating substrate 151 in the same way as the second power source terminal 12 shown in FIG. 2. A forward end of the second power source terminal 12 penetrates the side wall of the case 152 located on the side of the second long side 151d of the insulating substrate 151, and protrudes outwardly from the case 152.

The second main-circuit gate-land 182 is electrically connected to the second main-circuit gate terminal 16 by means of a bonding wire 193. The second source sense-land 183 is connected to the second source sense terminal 18 by means of a bonding wire 194.

A basal end of the first output terminal 19 is joined to the lengthwise center of the surface of the connection portion 173 of the common land 170. The first output terminal 19 is an electrically-conductive plate-like element. The first output terminal 19 is shaped like a crank when viewed from the length direction of the insulating substrate 151 in the same way as the first output terminal 19 shown in FIG. 2. A forward end of the first output terminal 19 penetrates the side wall of the case 152 located on the side of the first long side 151c of the insulating substrate 151, and protrudes outwardly from the case 152.

For example, a substrate (DBC: Direct Bonding Copper) in which a copper foil is bonded directly to ceramics may be used instead of the insulating substrate 151. If so, the lands 161 to 163, 170, and 181 to 183 can be formed by the copper foil.

The chip 25A in which the first short-circuit MOSFET 25 is formed is mounted near the terminals 13 and 15 on the gate drive circuit mounting board 300. Additionally, the chip 26A in which the second short-circuit MOSFET 26 is formed is mounted near the terminals 16 and 18 on the gate drive circuit mounting board 300.

The drain terminal of the chip 25A is electrically connected to the first main-circuit gate terminal 13 by means of a lead wire 301. The source terminal of the chip 25A is electrically connected to the first source sense terminal 15 by means of a lead wire 302. The gate terminal of the chip 25A is connected to the gate drive circuit 3 mounted on the gate drive circuit mounting board 300 by means of a lead wire 303.

On the other hand, the drain terminal of the chip 26A is electrically connected to the second main-circuit gate terminal 16 by means of a lead wire 304. The source terminal of the chip 26A is electrically connected to the second source sense terminal 18 by means of a lead wire 305. The gate terminal of the chip 26A is connected to the gate drive circuit 3 mounted on the gate drive circuit mounting board 300 by means of a lead wire 306.

It is permissible to form an arrangement in which a plurality of electrodes to which the drain terminal of the chip 25A, the source terminal of the chip 25A, the drain terminal of the chip 26A, and the source terminal of the chip 26A are respectively connected are formed on the lower surface of the gate drive circuit mounting board 300 and in which a forward end of the first main-circuit gate terminal 13, a forward end of the first source sense terminal 15, a forward end of the second main-circuit gate terminal 16, and a forward end of the second source sense terminal 18 are brought into contact with the corresponding electrodes formed on the lower surface of the gate drive circuit mounting board 300 in a state of being pressed thereagainst. More specifically, a state in which the forward ends of the terminals 13, 15, 16, and 18 are pressed against the corresponding electrodes formed on the lower surface of the gate drive circuit mounting board 300 is reached by providing an elastic member such as a spring, which presses the terminals 13, 15, 16, and 18 toward the gate drive circuit mounting board 300, between the lower ends of the terminals 13, 15, 16, and 18 and the insulating substrate 151.

It is conceivable that the chip in which the first short-circuit MOSFET 25 is formed and the chip in which the second short-circuit MOSFET 26 is formed are disposed in the gate drive circuit 3. However, if this arrangement is employed, the wires by which the main-circuit MOSFETs 21 and 22 and the short-circuit MOSFETs 25 and 26 are connected together in the power module 2 will become long. Therefore, even if the short-circuit MOSFETs 25 and 26 are in an ON state, the gate-to-source impedance of the main-circuit MOSFETs 21 and 22 will become high, and, if a displacement current flows between the gate and the source, a voltage drop will occur because of that impedance. Therefore, there is a fear that the rise-restraining effect of the gate-to-source voltage of the main-circuit MOSFETs 21 and 22 will be ruined.

As described above, if the chip in which the first short-circuit MOSFET 25 is formed and the chip in which the second short-circuit MOSFET 26 is formed are connected between the module terminals inside or outside the case 51 of the power module 2, wires by which the module terminals and the short-circuit MOSFETs 25 and 26 are connected together can be shortened. This makes it possible to reduce the gate-to-source impedance of the main-circuit MOSFETs 21 and 22 when the short-circuit MOSFETs 25 and 26 are in an ON state. Therefore, even if a displacement current flows to the gate-to-source portion of the main-circuit MOSFETs 21 and 22, a voltage drop resulting from the gate-to-source impedance hardly occurs. Therefore, the rise-restraining effect of the gate-to-source voltage of the main-circuit MOSFETs 21 and 22 can be made greater than when a chip in which a short-circuit MOSFET is formed is provided in the gate drive circuit 3. In the power module 2 described with reference to FIG. 1, the impedance between the main-circuit MOSFETs 21 and 22 and the short-circuit MOSFETs 25 and 26 corresponding thereto is even smaller, and therefore the rise-restraining effect of the gate-to-source voltage of the main-circuit MOSFETs 21 and 22 can be made even greater.

Additionally, in the above embodiment, the main-circuit MOSFET and the short-circuit MOSFET connected between the gate and the source of the main-circuit MOSFET are disposed in the mutually different chips, and yet these may be disposed in the same chip. More specifically, as shown by the broken line 91 in FIG. 1, the first main-circuit MOSFET 21 and the first short-circuit MOSFET 25 may be disposed in the same chip. In other words, the MOSFETs 21 and 25 may be formed on the same semiconductor substrate. Likewise, as shown by the broken line 92 in FIG. 1, the second main-circuit MOSFET 22 and the second short-circuit MOSFET 26 may be disposed in the same chip. In other words, the MOSFETs 22 and 26 may be formed on the same semiconductor substrate. This makes it possible to reduce the power module in size. Additionally, this makes it possible to make the impedance between the main-circuit MOSFETs 21 and 22 and the short-circuit MOSFETs 25 and 26 corresponding thereto even smaller.

FIG. 6 is a perspective view showing an exterior of a chip 91 in which the first main-circuit MOSFET 21 and the first short-circuit MOSFET 25 are formed on the same semiconductor substrate.

The first main-circuit MOSFET 21 and the first short-circuit MOSFET 25 are disposed in the chip 91. This chip 91 has its one surface on which the drain electrode $21_D$ of the first main-circuit MOSFET 21 is disposed. The chip 91 has its opposite surface on which the source electrode $21_S$ and the gate electrode $21_G$ of the first main-circuit MOSFET 21 and the gate electrode $25_G$ of the first short-circuit MOSFET 25 are disposed.

Figure 7A:
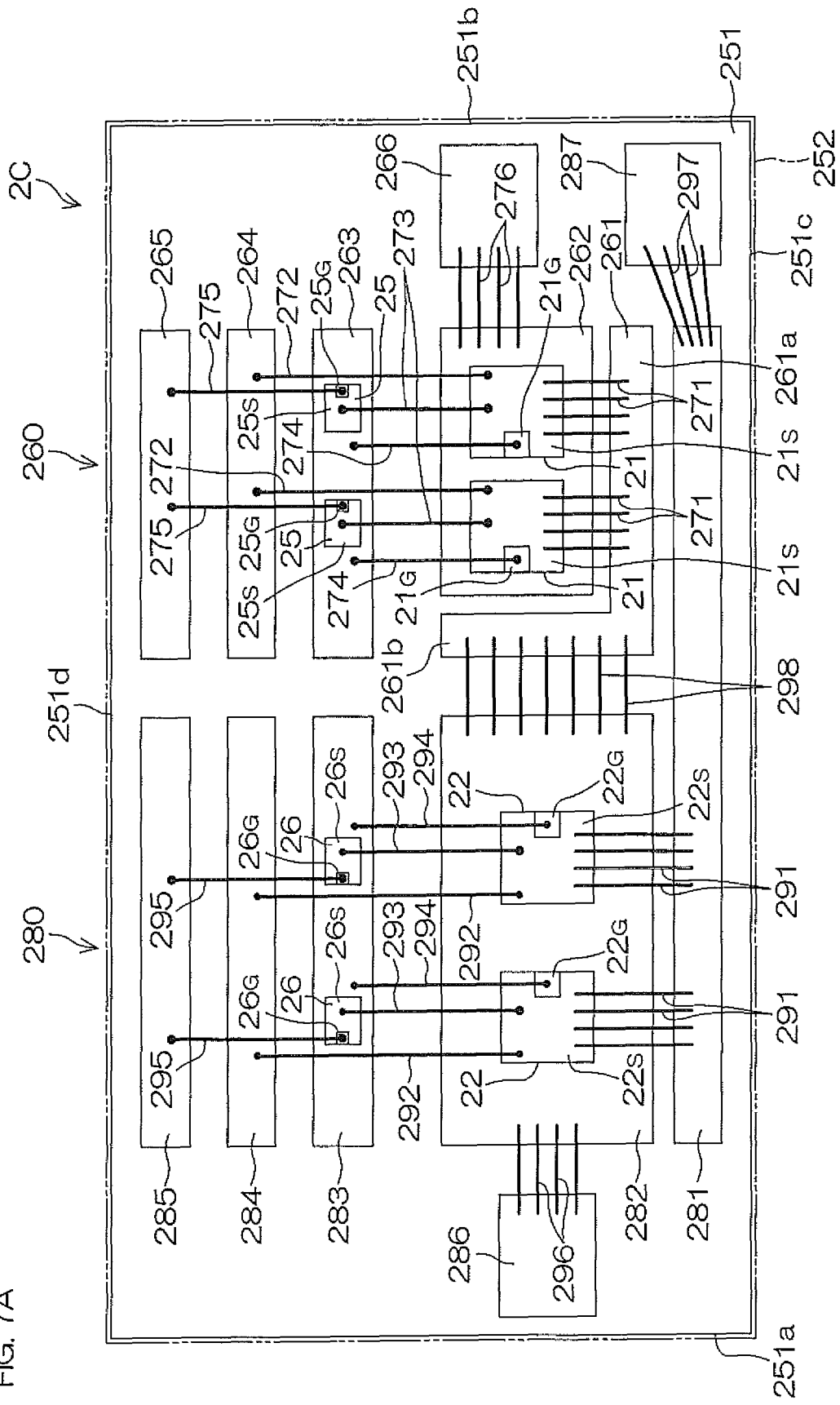
FIG. 7A shows another example of the power module, and is a pictorial plan view showing an internal structure of the power module.
Figure 8:
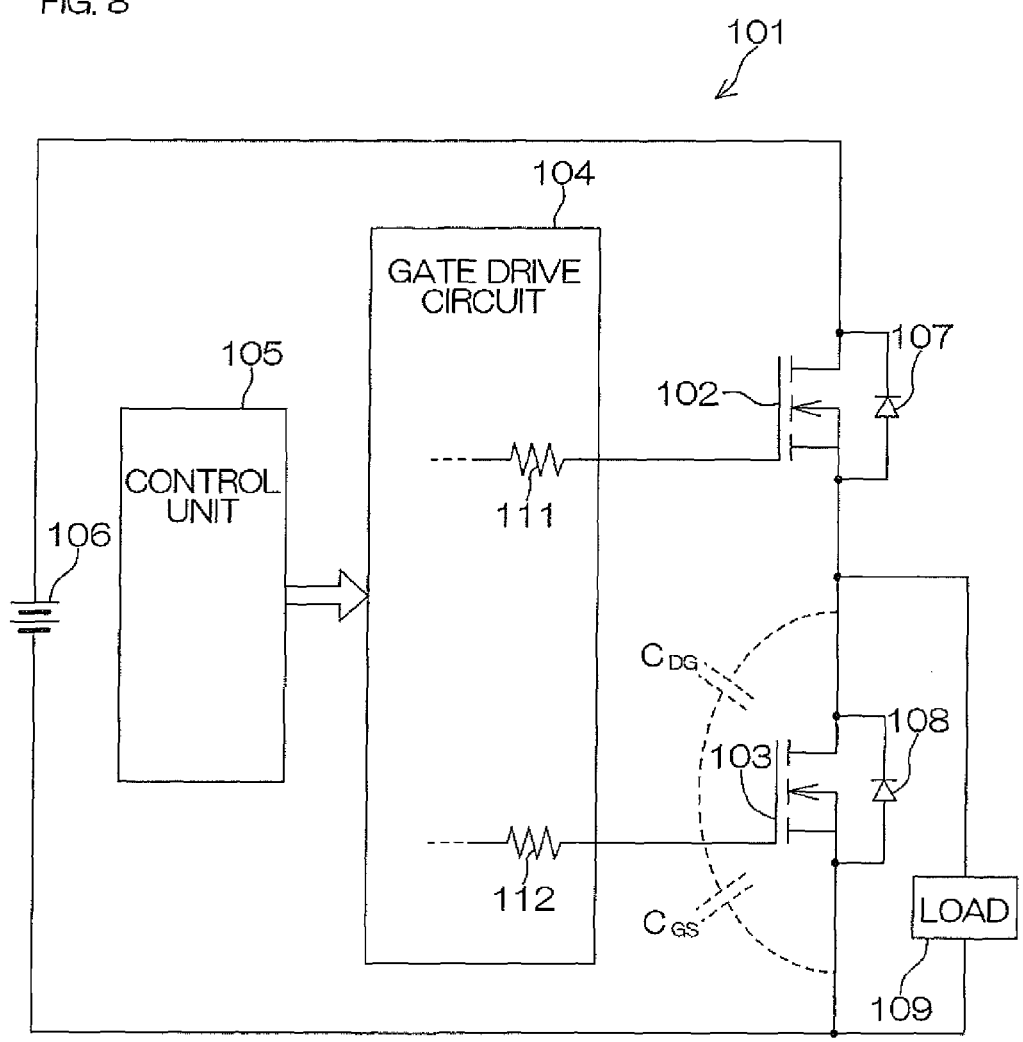
FIG. 8 is an electric circuit diagram showing an example of a conventional half-bridge output circuit.

FIG. 7A and FIG. 7B show another example of the power module of FIG. 2. FIG. 7A is a pictorial plan view showing an internal structure of the power module. FIG. 7B is a pictorial plan view showing an exterior of the power module.

This power module 2C differs from the power module 2 shown in FIGS. 1 and 2 in number and in arrangement of main-circuit MOSFETs and short-circuit MOSFETs. More specifically, the high-side circuit includes two first main-circuit MOSFETs 21 connected in parallel and two first short-circuit MOSFETs 25 connected between the gate and the source of each first main-circuit MOSFET 21. Likewise, the low-side circuit includes two second main-circuit MOSFETs 22 connected in parallel and two second short-circuit MOSFETs 26 connected between the gate and the source of each second main-circuit MOSFET 22.

In FIG. 7A, an example is shown in which a diode connected in parallel to each main-circuit MOSFET 21, 22 is built into each main-circuit MOSFET 21, 22. Additionally, in FIG. 7A, each terminal is omitted.

The power module 2C includes an insulating substrate 251 and a case 252 fixed to one of the surfaces of the insulating substrate 251. The insulating substrate 251 is formed in the shape of a rectangle that is long in one direction when viewed planarly. The case 252 is formed in a substantially rectangular parallelepiped shape having its lower surface that is opened, and is made of a resin material.

One of two short sides of the insulating substrate 251 is defined as a "first short side 251a" when viewed planarly, whereas the other short side is defined as a "second short side 251b" when viewed planarly. Additionally, one of two long sides of the insulating substrate 251 is defined as a "first long side 251c" when viewed planarly, whereas the other long side is defined as a "second long side 251d" when viewed planarly. Additionally, a direction along the long sides 251c and 251d of the insulating substrate 251 is defined as a "length direction of the insulating substrate 251," whereas a direction along the short sides 251a and 251b of the insulating substrate 251 is defined as a "width direction of the insulating substrate 251."

A first assembly 260 for forming a high-side circuit and a second assembly 280 for forming a low-side circuit are arranged on the insulating substrate 251 side by side in the length direction of the insulating substrate 251. The first assembly 260 is disposed in an area between the center in the length direction of the insulating substrate 251 and the second short side 251b. On the other hand, most of the second assembly 280 is disposed in an area between the center in the length direction of the insulating substrate 251 and the first short side 251a.

The first assembly 260 includes a plurality of lands 261 to 266 formed on the insulating substrate 251, two first main-circuit MOSFETs 21, two first short-circuit MOSFETs 25, and a plurality of terminals 11, 13, 14, and 15 (see FIG. 7B). The lands 261 to 265 include a first main-circuit source-land 261, a first main-circuit drain-land 262, a first main-circuit gate-land 263, a first source sense-land 264, a first short-circuit gate-land 265, and a first power-source terminal connection land 266. These lands 261 to 266 are plate-like elements each of which is made of copper or aluminum.

The first main-circuit source-land 261 is shaped substantially like the letter L when viewed planarly, and is disposed near the first long side 251c of the insulating substrate 251, and has a first rectangular part 261a long in the length direction of the insulating substrate 251 and a second rectangular part 261b extending from an end of the first rectangular part 261a on the side of the first short side 251a of the insulating substrate 251 toward the second long side 251d of the insulating substrate 251.

The first main-circuit drain-land 262 has a substantially rectangular shape long in the length direction of the insulating substrate 251 when viewed planarly, and is disposed adjacently to the first rectangular part 261a on the side opposite to the first long side 251c of the insulating substrate 251 with respect to the first rectangular part 261a of the first main-circuit source-land 261. The first main-circuit gate-land 263 has the shape of a rectangle long in the length direction of the insulating substrate 251 when viewed planarly, and is disposed adjacently to the first main-circuit drain-land 262 on the side opposite to the first long side 251c of the insulating substrate 251 with respect to the first main-circuit drain-land 262.

The first source sense-land 264 has the shape of a rectangle long in the length direction of the insulating substrate 251 when viewed planarly, and is disposed adjacently to the first main-circuit gate-land 263 on the side opposite to the first long side 251c of the insulating substrate 251 with respect to the first main-circuit gate-land 263. The first short-circuit gate-land 265 has the shape of a rectangle long in the length direction of the insulating substrate 251 when viewed planarly, and is disposed adjacently to the first source sense-land 264 on the side opposite to the first long side 251c of the insulating substrate 251 with respect to the first source sense-land 264.

The first power-source terminal connection land 266 has the shape of a rectangle when viewed planarly, and is disposed adjacently to the first main-circuit drain-land 262 on the side opposite to the first short side 251a of the insulating substrate 251 with respect to the first main-circuit drain-land 262.

A drain electrode of each of the first main-circuit MOSFETs 21 is joined to a surface of the first main-circuit drain-land 262. Each of the first main-circuit MOSFETs 21 has a source electrode $21_S$ and a gate electrode $21_G$ on its surface opposite to the first main-circuit drain-land 262. A drain electrode of each of the first short-circuit MOSFETs 25 is joined to a surface of the first main-circuit gate-land 263. Each of the first short-circuit MOSFETs 25 has a source electrode $25_S$ and a gate electrode $25_G$ on its surface opposite to the first main-circuit gate-land 263.

The source electrode $21_S$ of each of the first main-circuit MOSFETs 21 is electrically connected to the first main-circuit source-land 261 by means of a plurality of bonding wires 271. Additionally, the source electrode $21_S$ (current detecting element 27) of each of the first main-circuit MOSFETs 21 is electrically connected to the first source sense-land 264 by means of a bonding wire 272. Still additionally, the source electrode $21_S$ of each of the first main-circuit MOSFETs 21 is electrically connected to the source electrode $25_S$ of the first short-circuit MOSFET 25 corresponding thereto by means of a bonding wire 273.

The gate electrode $21_G$ of each of the first main-circuit MOSFETs 21 is electrically connected to the first main-circuit gate-land 263 by means of a bonding wire 274. The gate electrode $25_G$ of each of the first short-circuit MOSFETs 25 is electrically connected to the first short-circuit gate-land 265 by means of a bonding wire 275.

The first main-circuit drain-land 262 is electrically connected to the first power-source terminal connection land 266 by means of a plurality of bonding wires 276. The first power source terminal 11 (see FIG. 7B) is electrically connected to the first power-source terminal connection land 266. A forward end of the first power source terminal 11 penetrates a side wall of the case 252 located on the side of the second short side 251b of the insulating substrate 251, and protrudes outwardly from the case 252.

The first main-circuit gate terminal 13 (see FIG. 7B) is electrically connected to the first main-circuit gate-land 263. A forward end of the first main-circuit gate terminal 13 penetrates an upper wall of the case 252, and protrudes outwardly from the case 252. The first source sense terminal 15 (see FIG. 7B) is electrically connected to the first source sense-land 264. A forward end of the first source sense terminal 15 penetrates the upper wall of the case 252, and protrudes outwardly from the case 252. The first short-circuit gate terminal 14 (see FIG. 7B) is electrically connected to the first short-circuit gate-land 265. A forward end of the first short-circuit gate terminal 14 penetrates the upper wall of the case 252, and protrudes outwardly from the case 252.

The second assembly 280 includes a plurality of lands 281 to 287 formed on the insulating substrate 251, two second main-circuit MOSFETs 22, two second short-circuit MOSFETs 26, and a plurality of terminals 12, 16, 17, 18, and 19 (see FIG. 7B). The lands 281 to 287 include a second main-circuit source-land 281, a second main-circuit drain-land 282, a second main-circuit gate-land 283, a second source sense-land 284, a second short-circuit gate-land 285, a first output-terminal connection land 286, and a second power-source terminal connection land 287. These lands 281 to 287 are plate-like elements each of which is made of copper or aluminum.

The second main-circuit drain-land 282 has a substantially rectangular shape long in the length direction of the insulating substrate 251 when viewed planarly, and is disposed adjacently to the second rectangular part 261b on the side opposite to the second short side 251b of the insulating substrate 251 with respect to the second rectangular part 261b of the first main-circuit source-land 261. The second main-circuit source-land 281 has a substantially rectangular shape long in the length direction of the insulating substrate 251, and is disposed adjacently to the second main-circuit drain-land 282 and the first rectangular part 261a on the side opposite to the second long side 251d of the insulating substrate 251 with respect to the second main-circuit drain-land 282 and the first rectangular part 261a of the first main-circuit source-land 261.

The second main-circuit gate-land 283 has the shape of a rectangle long in the length direction of the insulating substrate 251 when viewed planarly, and is disposed adjacently to the second main-circuit drain-land 282 on the side opposite to the first long side 251c of the insulating substrate 251 with respect to the second main-circuit drain-land 282. The second source sense-land 284 has the shape of a rectangle long in the length direction of the insulating substrate 251 when viewed planarly, and is disposed adjacently to the second main-circuit gate-land 283 on the side opposite to the first long side 251c of the insulating substrate 251 with respect to the second main-circuit gate-land 283.

The second short-circuit gate-land 285 has the shape of a rectangle long in the length direction of the insulating substrate 251 when viewed planarly, and is disposed adjacently to the second source sense-land 284 on the side opposite to the first long side 251c of the insulating substrate 251 with respect to the second source sense-land 284. The first output-terminal connection land 286 has the shape of a rectangle when viewed planarly, and is disposed adjacently to the second main-circuit drain-land 282 on the side opposite to the second short side 251b of the insulating substrate 251 with respect to the second main-circuit drain-land 282.

The second power-source terminal connection land 287 has the shape of a rectangle when viewed planarly, and is disposed adjacently to the second main-circuit source-land 281 on the side opposite to the first short side 251a of the insulating substrate 251 with respect to the second main-circuit source-land 281.

A drain electrode of each of the second main-circuit MOSFETs 22 is joined to a surface of the second main-circuit drain-land 282. Each of the second main-circuit MOSFETs 22 has a source electrode $22_S$ and a gate electrode $22_G$ on its surface opposite to the second main-circuit drain-land 282. A drain electrode of each of the second short-circuit MOSFETs 26 is joined to a surface of the second main-circuit gate-land 283. Each of the second short-circuit MOSFETs 26 has a source electrode $26_S$ and a gate electrode $26_G$ on its surface opposite to the second main-circuit gate-land 283.

The source electrode $22_S$ of each of the second main-circuit MOSFETs 22 is electrically connected to the second main-circuit source-land 281 by means of a plurality of bonding wires 291. Additionally, the source electrode $22_S$ (current detecting element 28) of each of the second main-circuit MOSFETs 22 is electrically connected to the second source sense-land 284 by means of a bonding wire 292. Still additionally, the source electrode $22_S$ of each of the second main-circuit MOSFETs 22 is electrically connected to the source electrode 26$_S$ of the second short-circuit MOSFET 26 corresponding thereto by means of a bonding wire 293.

The gate electrode 22$_G$ of each of the second main-circuit MOSFETs 22 is electrically connected to the second main-circuit gate-land 283 by means of a bonding wire 294. The gate electrode 26$_G$ of each of the second short-circuit MOSFETs 26 is electrically connected to the second short-circuit gate-land 285 by means of a bonding wire 295.

The second main-circuit drain-land 282 is electrically connected to the first main-circuit source-land 261 by means of a plurality of bonding wires 298. Additionally, the second main-circuit drain-land 282 is electrically connected to the first output-terminal connection land 286 by means of a plurality of bonding wires 296. The first output terminal 19 (see FIG. 7B) is electrically connected to the first output-terminal connection land 286. The first output terminal 19 divides into two on its way in the case 252, and has two forward ends. Each forward end penetrates a side wall of the case 252 located on the side of the first short side 251a of the insulating substrate 251, and protrudes outwardly from the case 252.

The second main-circuit source-land 281 is electrically connected to the second power-source terminal connection land 287 by means of a plurality of bonding wires 297. The second power source terminal (second output terminal) (see FIG. 7B) is electrically connected to the second power-source terminal connection land 287. A forward end of the second power source terminal 12 penetrates the side wall of the case 252 on the side of the second short side 251b of the insulating substrate 251, and protrudes outwardly from the case 252.

The second main-circuit gate terminal 16 (see FIG. 7B) is electrically connected to the second main-circuit gate-land 283. A forward end of the second main-circuit gate terminal 16 penetrates an upper wall of the case 252, and protrudes outwardly from the case 252. The second source sense terminal 18 (see FIG. 7B) is electrically connected to the second source sense-land 284. A forward end of the second source sense terminal 18 penetrates the upper wall of the case 252, and protrudes outwardly from the case 252. The second short-circuit gate terminal 17 (see FIG. 7B) is electrically connected to the second short-circuit gate-land 285. A forward end of the second short-circuit gate terminal 17 penetrates the upper wall of the case 252, and protrudes outwardly from the case 252.

For example, a substrate (DBC: Direct Bonding Copper) in which a copper foil is bonded directly to ceramics may be used instead of the insulating substrate 251. If so, the lands 261 to 266 and 281 to 287 can be formed by the copper foil.

In the above embodiment, the first and second main-circuit MOSFETs 21 and 22 and the first and second short-circuit MOSFETs 25 and 26 are SiC devices, and yet each of the MOSFETs 21, 22, 25, and 26 may be formed by an Si device that uses Si (silicon) as a semiconducting material. Additionally, in the above embodiment, MOSFETs are used as the power switching devices 21 and 22, and yet another type of switching device, such as an IGBT (Insulated Gate Bipolar Transistor), may be used as the power switching devices 21 and 22. Additionally, as described in the above embodiment, the MOSFETs 21, 22, 25, and 26 are connected by use of the wires, and yet ribbon-like or lead-like connection metal members may be used instead thereof. Additionally, the material of these connection metal members may be Au, Cu, Al, etc.

Although the embodiments of the present invention have been described in detail as above, these are merely specific examples used to clarify the technical contents of the present invention, and the present invention should not be understood as being limited to these examples, and the scope of the present invention is to be determined solely by the appended claims.

The present application corresponds to Japanese Patent Application No. 2010-175403 filed in the Japan Patent Office on Aug. 4, 2010, and the entire disclosure of the application is incorporated herein by reference.

REFERENCE SIGNS LIST 2, 2A, 2B, 2C Power module
3 Gate drive circuit
4 Control unit
21 First main-circuit MOSFET
22 Second main-circuit MOSFET
25 First short-circuit MOSFET
26 Second short-circuit MOSFET
51, 151, 251 Insulating substrate

The invention claimed is:

1. A power module comprising:
a first power switching device;
a second power switching device connected in series to the first power switching device;
a first gate short-circuit switching device connected between a gate and a source of the first power switching device; and
a second gate short-circuit switching device connected between a gate and a source of the second power switching device;
wherein the first power switching device and the first gate short-circuit switching device are mounted on a same mounting substrate,
wherein the second power switching device and the second gate short-circuit switching device are mounted on a same mounting substrate,
wherein the power module further comprises:
a first connection metal member for connecting the first power switching device and the first gate short-circuit switching device together; and
a second connection metal member for connecting the second power switching device and the second gate short-circuit switching device together, and
wherein the first connection metal member and the second connection metal member are wire-like or frame-like or ribbon-like connection metal members each of which is made of Au or Cu or Al.

2. The power module according to claim 1, wherein the first power switching device and the second power switching device are switching devices each of which is composed mainly of silicon carbide.

3. The power module according to claim 1, wherein each of the first power switching device and the second power switching device comprises an IGBT.

4. The power module according to claim 1, wherein the mounting substrate on which the first power switching device and the first gate short-circuit switching device are mounted and the mounting substrate on which the second power switching device and the second gate short-circuit switching device are mounted are same.

5. The power module according to claim 4, further comprising an electrically-conductive common land that is formed on the mounting substrate and to which a source of either one of the first power switching device and the second power switching device is electrically connected and to which a drain of a remaining one of the power switching devices is electrically connected, the common land being a plate-like element shaped substantially like the letter U when viewed planarly.

6. The power module according to claim 4, further comprising an electrically-conductive common land that is formed on the mounting substrate and to which a source of either one of the first power switching device and the second power switching device is electrically connected and to which a drain of a remaining one of the power switching devices is electrically connected,
the common land being a plate-like element made of copper or aluminum.

7. The power module according to claim 6, further comprising:
a first gate-land that is formed on the mounting substrate, and to which the gate of the first power switching device is electrically connected, and to which the first gate short-circuit switching device is joined;
a first short-circuit gate-land that is formed on the mounting substrate and to which a gate of the first gate short-circuit switching device is electrically connected;
a second gate-land that is formed on the mounting substrate, and to which the gate of the second power switching device is electrically connected, and to which the second gate short-circuit switching device is joined; and
a second short-circuit gate-land that is formed on the mounting substrate and to which a gate of the second gate short-circuit switching device is electrically connected;
wherein the common land includes a pair of arm portions and a connection portion by which the pair of arm portions are connected together, and
wherein either one of a group of the first gate-land and the first short-circuit gate-land and a group of the second gate-land and the second short-circuit gate-land is disposed between the pair of arm portions of the common land whereas a remaining one of the groups is disposed on a side opposite to the either one with respect to one of the pair of arm portions of the common land.

8. The power module according to claim 7, wherein the first gate-land and the first short-circuit gate-land are disposed adjacently in a direction in which the connection portion of the common land extends, and
wherein the second gate-land and the second short-circuit gate-land are disposed adjacently in a direction in which the connection portion of the common land extends.

9. The power module according to claim 7, wherein the mounting substrate is a DBC substrate in which a copper foil is bonded directly to ceramics, and
wherein the common land, the first gate-land, the first short-circuit gate-land, the second gate-land, and the second short-circuit gate-land are made of the copper foil.

10. The power module according to claim 1, wherein the first power switching device and the first gate short-circuit switching device are disposed in a same chip, and the second power switching device and the second gate short-circuit switching device are disposed in a same chip.

11. The power module according to claim 1, wherein the first power switching device and the second power switching device are alternately turned on with a dead time between respective ON states of the power switching devices,
wherein the first gate short-circuit switching device is turned on before the second power switching device is turned on, and the first gate short-circuit switching device is turned off before the first power switching device is turned on after a first predetermined period of time elapses after the second power switching device is turned on, and
wherein the second gate short-circuit switching device is turned on before the first power switching device is turned on, and the second gate short-circuit switching device is turned off before the second power switching device is turned on after a second predetermined period of time elapses after the first power switching device is turned on.

12. The power module according to claim 11, wherein the first predetermined period of time is set to be more than time during which a drain-to-source voltage of the first power switching device rises after the second power switching device is turned on, and
wherein the second predetermined period of time is set to be more than time during which a drain-to-source voltage of the second power switching device rises after the first power switching device is turned on.

13. The power module according to claim 11, wherein the first predetermined period of time is set to be 200 nsec or more, and the second predetermined period of time is set to be 200 nsec or more.

14. The power module according to claim 1, further comprising:
a first source sense terminal to which a first current detecting element included in the first power switching device is connected; and
a second source sense terminal to which a second current detecting element included in the second power switching device is connected.

15. An output circuit comprising:
the power module according to claim 1;
a gate drive circuit that drives the first power switching device, the second power switching device, the first gate short-circuit switching device, and the second gate short-circuit switching device; and
a control unit that controls the gate drive circuit;
the control unit comprising a microcomputer.

16. The output circuit according to claim 15, wherein the control unit includes a unit for generating a gate control signal with respect to the first power switching device, the second power switching device, the first gate short-circuit switching device, and the second gate short-circuit switching device, and
wherein the gate drive circuit generates respective gate drive signals corresponding to the gate control signals generated by the control unit, and supplies the gate drive signal to a gate of a corresponding one of the switching devices.

17. The power module according to claim 5, further comprising:
a first gate-land that is formed on the mounting substrate, and to which the gate of the first power switching device is electrically connected, and to which the first gate short-circuit switching device is joined;
a first short-circuit gate-land that is formed on the mounting substrate and to which a gate of the first gate short-circuit switching device is electrically connected;
a second gate-land that is formed on the mounting substrate, and to which the gate of the second power switching device is electrically connected, and to which the second gate short-circuit switching device is joined; and
a second short-circuit gate-land that is formed on the mounting substrate and to which a gate of the second gate short-circuit switching device is electrically connected;

wherein the common land includes a pair of arm portions and a connection portion by which the pair of arm portions are connected together, and wherein either one of a group of the first gate-land and the first short-circuit gate-land and a group of the second gate-land and the second short-circuit gate-land is disposed between the pair of arm portions of the common land whereas a remaining one of the groups is disposed on a side opposite to the either one with respect to one of the pair of arm portions of the common land.

18. The power module according to claim 17, wherein the first gate-land and the first short-circuit gate-land are disposed adjacently in a direction in which the connection portion of the common land extends, and wherein the second gate-land and the second short-circuit gate-land are disposed adjacently in a direction in which the connection portion of the common land extends.

* * * * *